US012672513B2

(12) United States Patent
Chew

(10) Patent No.: US 12,672,513 B2
(45) Date of Patent: Jun. 30, 2026

(54) METHOD OF COMPENSATING DIE SHIFT IN THE COMPRESSION MOLDING

(71) Applicant: PEP INNOVATION PTE. LTD., Singapore (SG)

(72) Inventor: Hwee Seng Chew, Singapore (SG)

( * ) Notice: Subject to any disclaimer, the term of this patent is extended or adjusted under 35 U.S.C. 154(b) by 280 days.

(21) Appl. No.: 18/665,663

(22) Filed: May 16, 2024

(65) Prior Publication Data

US 2024/0387222 A1     Nov. 21, 2024

(51) Int. Cl.
| | |
|---|---|
| *H01L 21/68* | (2006.01) |
| *H01L 21/67* | (2006.01) |
| *H01L 21/683* | (2006.01) |
| *H10P 72/00* | (2026.01) |
| *H10P 72/50* | (2026.01) |
| *H10P 72/70* | (2026.01) |

(52) U.S. Cl.
CPC .......... *H10P 72/53* (2026.01); *H10P 72/0428* (2026.01); *H10P 72/0606* (2026.01); *H10P 72/0614* (2026.01); *H10P 72/7402* (2026.01)

(58) Field of Classification Search
CPC ...... H10P 72/0428; H10P 72/50; H10P 72/53; H10P 72/0614; H10P 72/0606; H10P 72/7402
See application file for complete search history.

(56) References Cited

U.S. PATENT DOCUMENTS

| | | | |
|---|---|---|---|
| 2022/0012863 A1* | 1/2022 | Watanabe | ............... G06T 7/001 |
| 2024/0312819 A1* | 9/2024 | Yeon | ........................ H10P 72/50 |
| 2024/0404859 A1* | 12/2024 | Ushijima | ............... H10P 72/50 |

* cited by examiner

*Primary Examiner* — David C Spalla

(57) ABSTRACT

The present application relates to methods for compensating for die shift during compression molding of semiconductor dies. The method includes using a compensated marked carrier which includes a plurality of physical carrier markings derived from original projected markings. These original projected markings are generated through projection of original virtual carrier markings, based on a green file, and are transformed by applying a compensation factor in a computing apparatus. The method includes steps of bonding semiconductor dies onto the compensated marked carrier using the physical carrier markings, and performing compression molding to encapsulate the semiconductor dies into a molded panel. Additionally, the disclosure encompasses methods for fabricating the compensated marked carrier and applying these methods in a panel-level semiconductor packaging process.

20 Claims, 21 Drawing Sheets

S10

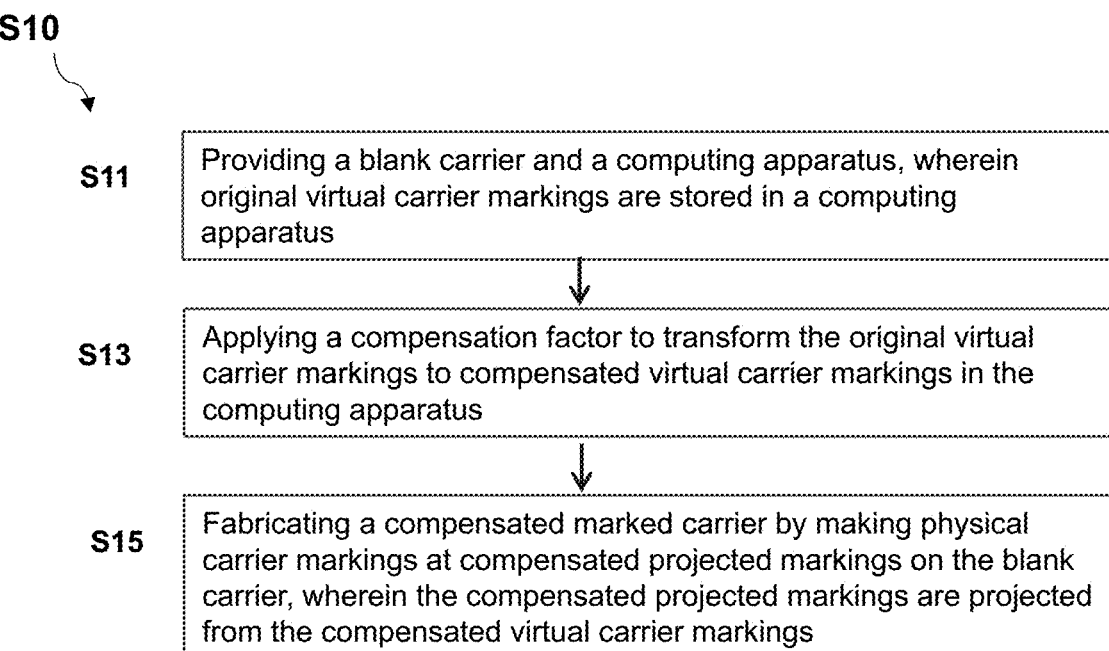

S11      Providing a blank carrier and a computing apparatus, wherein
         original virtual carrier markings are stored in a computing
         apparatus S13      Applying a compensation factor to transform the original virtual
         carrier markings to compensated virtual carrier markings in the
         computing apparatus S15      Fabricating a compensated marked carrier by making physical
         carrier markings at compensated projected markings on the blank
         carrier, wherein the compensated projected markings are projected
         from the compensated virtual carrier markings

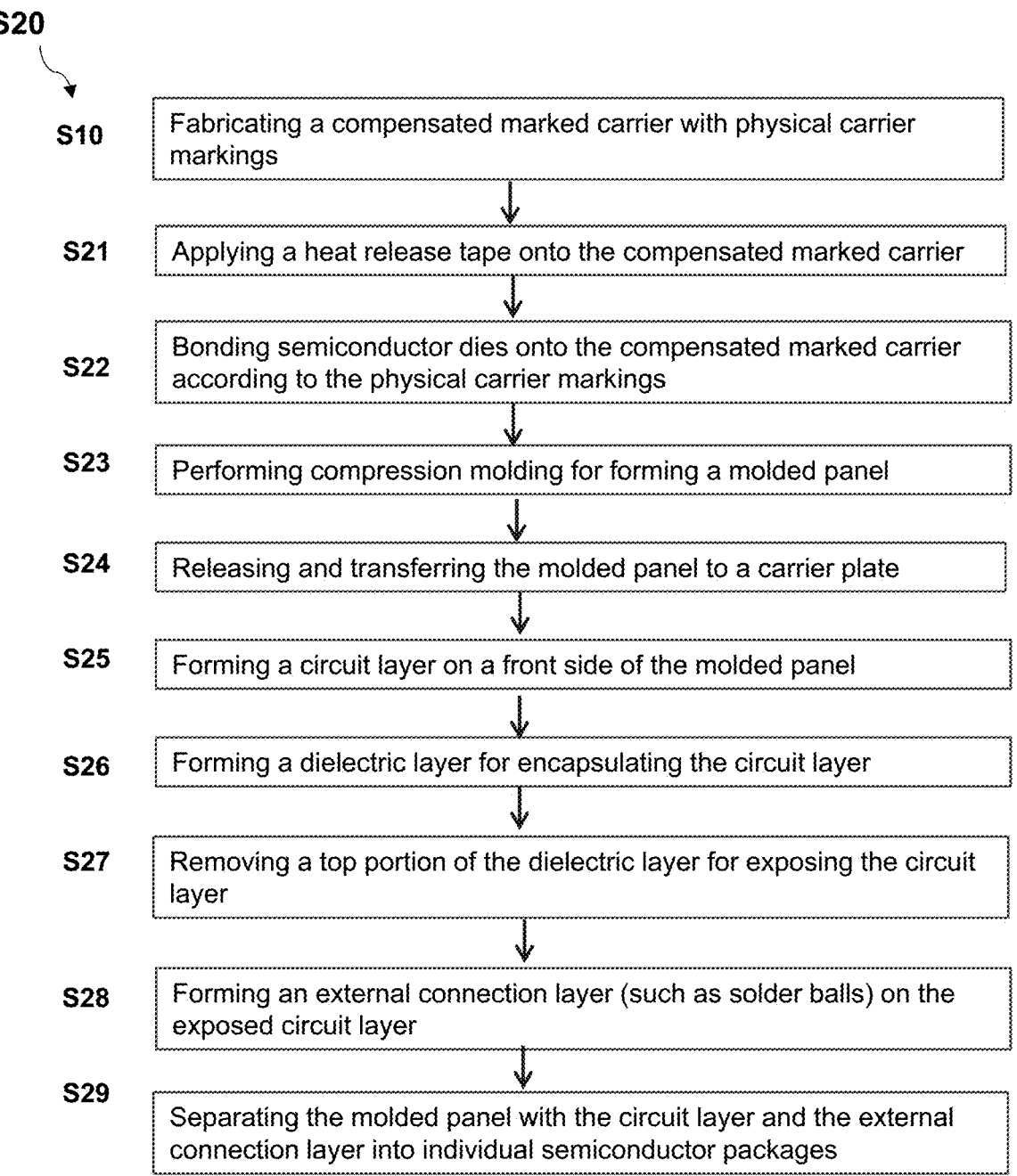

S10    Fabricating a compensated marked carrier with physical carrier markings

S21    Applying a heat release tape onto the compensated marked carrier

S22    Bonding semiconductor dies onto the compensated marked carrier according to the physical carrier markings S23    Performing compression molding for forming a molded panel S24    Releasing and transferring the molded panel to a carrier plate S25    Forming a circuit layer on a front side of the molded panel S26    Forming a dielectric layer for encapsulating the circuit layer S27    Removing a top portion of the dielectric layer for exposing the circuit layer S28    Forming an external connection layer (such as solder balls) on the exposed circuit layer S29    Separating the molded panel with the circuit layer and the external connection layer into individual semiconductor packages

FIG. 7

S23
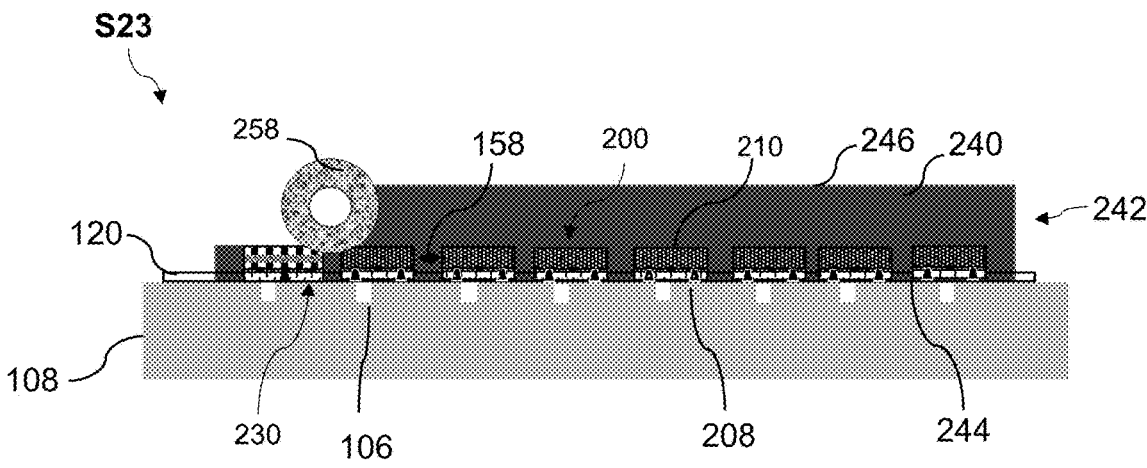
FIG. 12A
FIG. 12B
S24
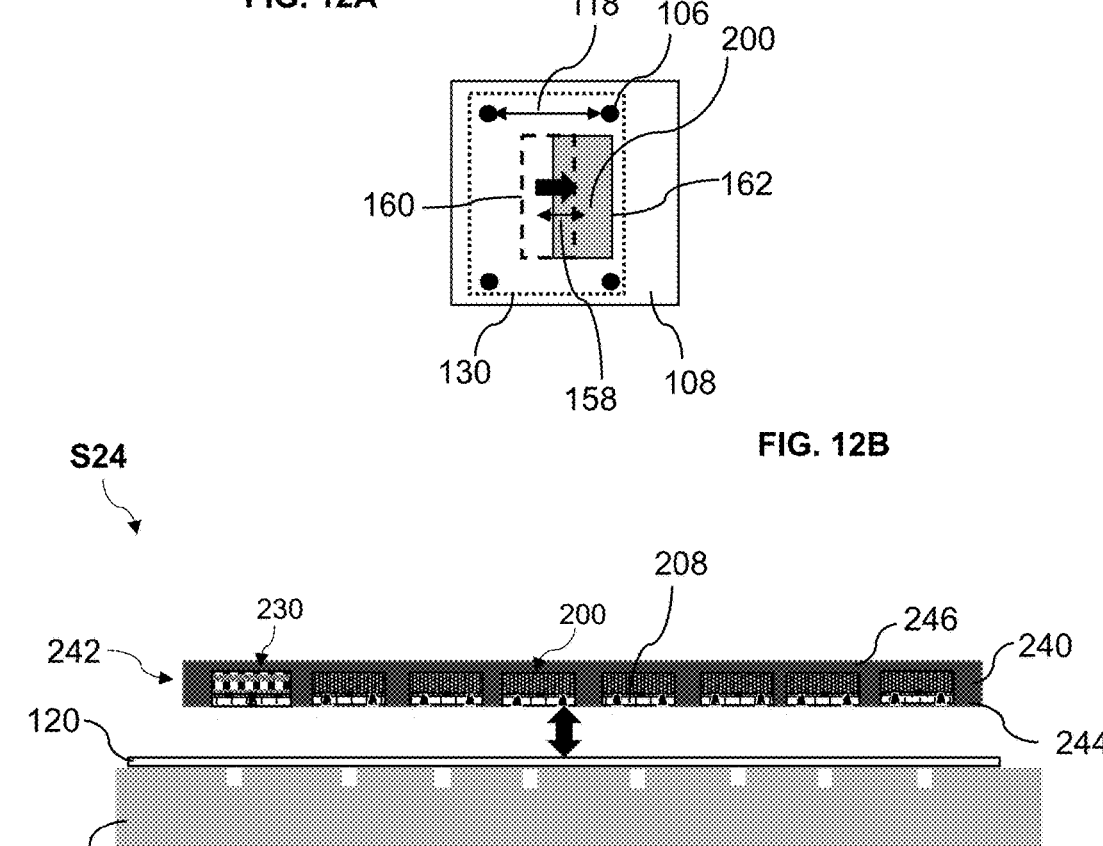
FIG. 13

S24

S26
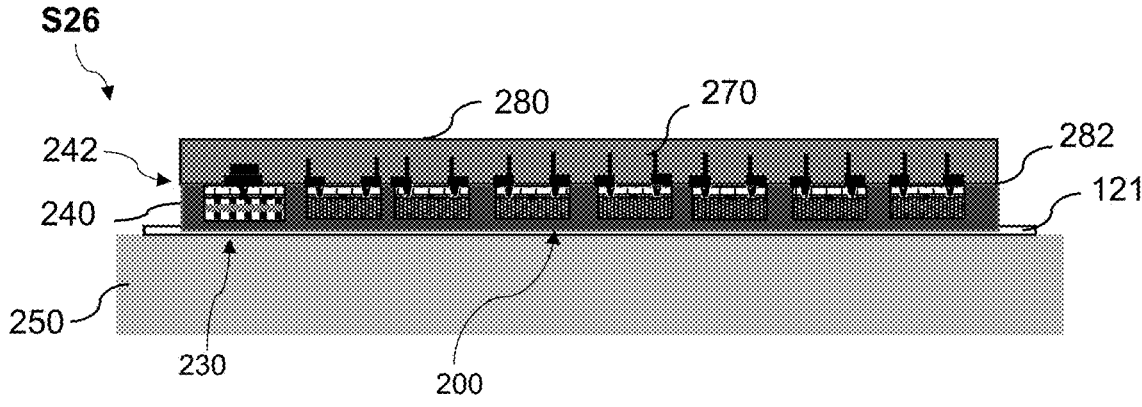
FIG. 19
S27
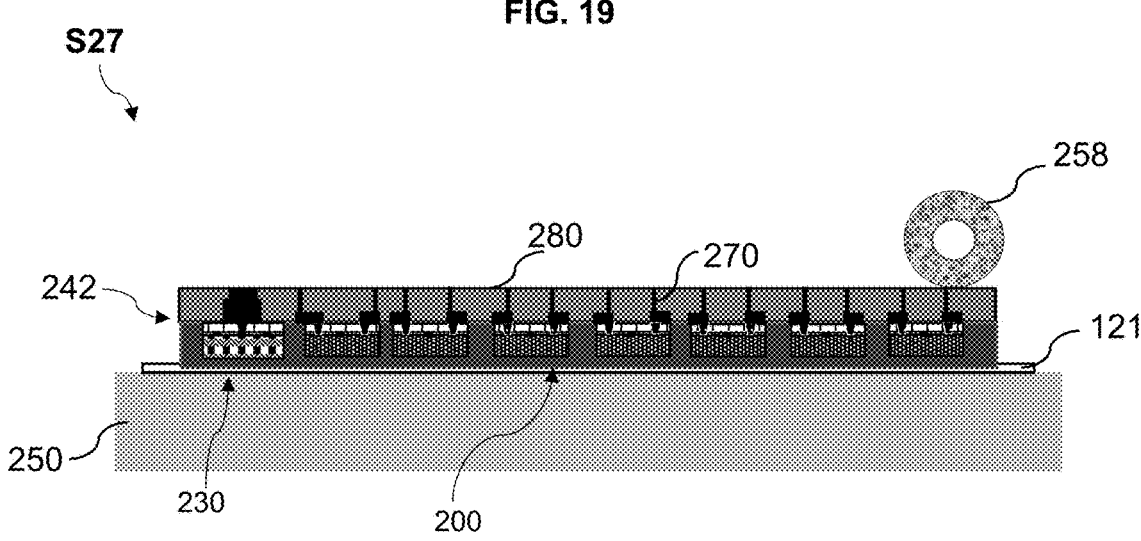
FIG. 20
S28
FIG. 21A

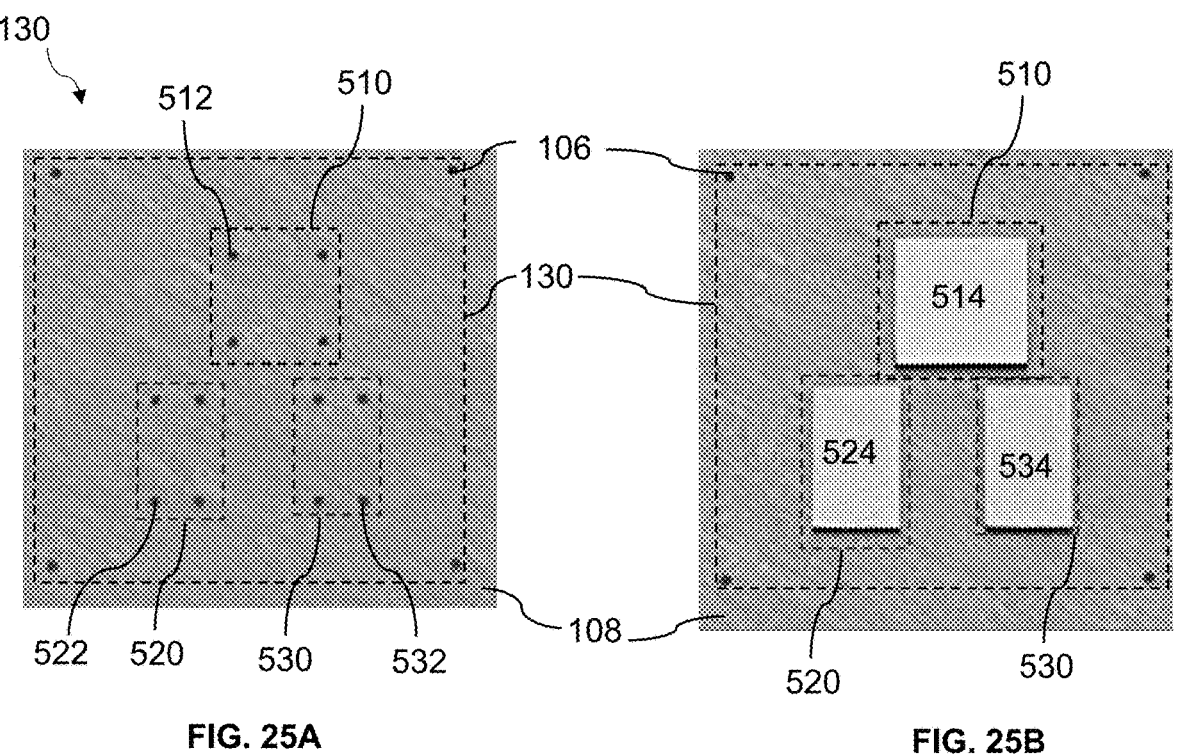
FIG. 25A                    FIG. 25B
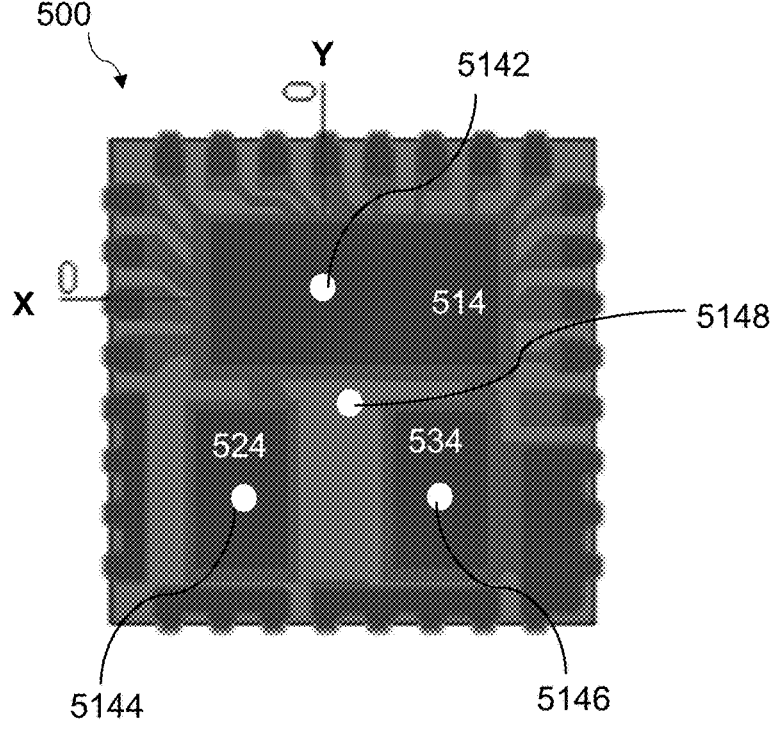
FIG. 26

METHOD OF COMPENSATING DIE SHIFT IN THE COMPRESSION MOLDING

CROSS-REFERENCE TO RELATED APPLICATIONS

This application claims the benefit of Singapore Provisional Application No. 10202301381R filed on May 17, 2023, the disclosure of which is herein incorporated by reference in its entirety for all purposes.

TECHNICAL FIELD

The present application relates to a method of compensating a die shift in the compression molding using a compensated marked carrier. The present application also relates to a method of fabricating the compensated marked carrier. The present application further relates to a panel-level semiconductor process using the method of compensating the die shift in the compression molding to make semiconductor packages.

BACKGROUND

Current the compression molding faces a serious problem of die shift in which bonded semiconductor dies would move away from its original or designed positions, due to various influences, such as thermal-mechanical (TM) effect and mold compound fluid flow (FF) effect. The die shift would cause misalignment in subsequent processes after the compression molding. The bonded semiconductor dies may go through expansion during the compression molding where they would move away from each other, so a gap between two adjacent semiconductor dies would increases. Alternatively, the bonded semiconductor dies may go through contraction during the compression molding where they would move closer to each other, so the gap between two adjacent semiconductor dies would decrease. The misalignment would occur in the subsequent processes if the semiconductor dies go through either the expansion or the contraction during the compression molding.

Therefore, the present application discloses a method for resolving the problem of die shift in the compression molding and further enhancing manufacturing yield of semiconductor packages.

SUMMARY

As a first aspect, the present application discloses a method of compensating a die shift of semiconductor dies in compression molding. The method includes providing a compensated marked carrier with a plurality of physical carrier markings. The physical carrier markings are made according to compensated projected markings transformed from original projected markings by a compensation factor in a computing apparatus. The original projected markings are generated by original virtual carrier markings through projection, and the original virtual carrier markings are derived from a green file. The method includes bonding the semiconductor dies onto the compensated marked carrier according to the physical carrier markings; and performing the compression molding to form a molding layer for encapsulating the semiconductor dies into a molded panel. The original projected markings and the compensated projected markings determine an original gap and a compensated gap respectively between two adjacent semiconductor dies. The die shift caused by the compression molding is compensated for by changing the original gap to the compensated gap when bonding the semiconductor dies onto the compensated marked carrier.

The method further includes applying a heat release tape onto a front surface of the compensated marked carrier before bonding the plurality of semiconductor dies onto the front surface, wherein the heat release tape is transparent or semi-transparent for detecting the physical carrier markings covered by the heat release tape.

The method further includes aligning the semiconductor dies to respective compensated bonding units divided on the compensated marked carrier before bonding the semiconductor dies, wherein the compensated bonding units are determined by the physical carrier markings.

The aligning the semiconductor dies includes determining a first virtual die reference point and a second virtual die reference point on an active surface of the semiconductor die; determining a first virtual carrier reference point and a second virtual carrier reference point on the compensated marked carrier from the physical carrier markings of the compensated bonding units; matching the first virtual die reference point and the second virtual die reference point to the first virtual carrier reference point and the second virtual carrier reference point, respectively.

The first virtual carrier reference point and the second virtual carrier reference point are determined by calculating a virtual carrier center from the four adjacent physical carrier markings; and shifting a first carrier distance and a second carrier distance from the virtual carrier center to determine the first virtual carrier reference point and the second virtual carrier reference point respectively.

The first virtual die reference point and the second virtual die reference point are determined by determining a virtual die center from special features of the semiconductor die; and shifting a first die distance and a second die distance from the virtual die center to determine the first virtual die reference point and the second virtual die reference point respectively.

The aligning the semiconductor dies is performed by a vision apparatus of a vertical co-axis configuration in which an alignment light is configured to be emitted from a single light source and then divided into a lookup beam and a look-down beam into a look-up camera assembly and a look-down camera assembly respectively.

The aligning the semiconductor dies is performed by a vision apparatus of a side-by-side configuration in which a first alignment light is configured to be emitted from a first light source and then reflected upwardly into a look-up camera assembly, and a second alignment light is configured to be emitted from a second light source and then reflected downwardly into a look-down camera assembly.

The method further includes performing a die location check (DLC) process to detect misalignment of the semiconductor dies in the molded panel for updating the original green file.

The method further includes separating the compensated marked carrier into a plurality of blocks, wherein each block has at least one reference die as an origin of a coordination system for the block for determining locations of the semiconductor dies more precisely within the block.

As a second aspect, the present application discloses a method of fabricating a compensated marked carrier for compensating a die shift of semiconductor dies in compression molding. The method includes providing a blank carrier with a plurality of original virtual carrier markings stored in a computing apparatus; transforming the original virtual carrier markings to compensated virtual carrier markings by applying a compensation factor in the computing apparatus; projecting the compensated virtual carrier markings onto the blank carrier for indicating locations of compensated projected markings on the blank carrier; and making physical carrier markings at the locations of the compensated projected markings on the blank carrier for forming the compensated marked carrier.

The method further includes calculating the compensation factor from a simulation plot by a simulation algorithm of the computing apparatus. The method further includes dividing the compensated marked carrier into a plurality of compensated bonding units by the compensated projected markings, wherein each compensated bonding unit is configured to accommodate at least one of the semiconductor dies.

The projecting the compensated virtual carrier markings onto the blank carrier includes generating a virtual fiducial in the computing apparatus; and overlapping the virtual fiducial to a carrier fiducial of the blank carrier. The making physical carrier markings includes forming grooves on a front surface of the compensated marked carrier at the locations of compensated projected markings, wherein the grooves are either cylindrical grooves or truncated grooves.

As a third aspect, the present application discloses a panel-level semiconductor process to make semiconductor packages. The method includes compensating a die shift of semiconductor dies in compression molding using a compensated marked carrier with a plurality of physical carrier markings. The physical carrier markings are made according to compensated projected markings transformed from original projected markings by a compensation factor in a computing apparatus. The original projected markings are generated by original virtual carrier markings through projection, and the original virtual carrier markings are derived from a green file. The method includes performing the compression molding to form a molding layer for encapsulating the semiconductor dies into a molded panel; releasing the molding panel from the compensated marked carrier and then transferring the molded panel onto a carrier plate in a flipped manner; forming a circuit layer on a front side of the molded panel; forming a dielectric layer onto the circuit layer for encapsulating the circuit layer; removing a top portion of the dielectric layer for exposing the circuit layer; forming an external connection layer coupled to the exposed circuit layer; and separating the molded panel, the circuit layer, the dielectric layer and the external connection layer into individual semiconductor packages. The original projected markings and the compensated projected markings determine an original gap and a compensated gap respectively between two adjacent semiconductor dies. The die shift caused by the compression molding is compensated by changing the original gap to the compensated gap when bonding the semiconductor dies onto the compensated marked carrier.

The method further includes performing a die location check (DLC) process to detect misalignment of the semiconductor dies in the molded panel; updating the original green file in the computing apparatus into an updated green file, according to the misalignment; and generating a circuit file according to the updated green file in the computing apparatus, wherein the circuit layer is formed according to the circuit file.

The updating the original green file includes comparing the misalignment of the semiconductor dies from the DLC process with a tolerance of the misalignment by a matching algorithm of the computing apparatus; labelling the semiconductor dies of which the misalignment is greater than the tolerance in a statistical diagram; and adjusting positions and/or orientations of the labelled semiconductor dies in the original green file.

The compensated projected markings are transformed from original projected markings by transforming the original virtual carrier markings to compensated virtual carrier markings in the computing apparatus by the compensation factor; and imaginarily forming the compensated projected markings from the compensated virtual carrier markings through projection, wherein the original gap is transformed to the compensated gap along with the transformation of the original projected markings to the compensated projected markings.

The method further includes dividing the compensated marked carrier into a plurality of compensated bonding units by the compensated projected markings; dividing at least one of the compensated bonding units into a plurality of sub-bonding units by sub-physical carrier markings within the compensated bonding unit; and bonding the semiconductor dies into the plurality of sub-bonding units respectively for forming Multi-Chip Modules (MCMs).

BRIEF DESCRIPTION OF THE DRAWINGS

The accompanying figures (FIGS.) illustrate embodiments and serve to explain principles of the disclosed embodiments. It is to be understood, however, that these figures are presented for purposes of illustration only, and not for defining limits of relevant applications.

FIG. 2 illustrates a flow chart of a method S10 of fabricating a compensated marked carrier according to an exemplary embodiment of the present disclosure;

FIG. 7 illustrates a flow chart of a compensating method S20 to a compression molding with the compensated marked carrier fabricated by the method S10, according to an exemplary embodiment of the present disclosure;

FIGS. 12A and 12B illustrate a schematic diagram of Step S23 of the compensating method S20;

FIG. 13 illustrates a schematic diagram of a releasing process in Step S24 of the compensating method S20;

FIG. 19 illustrates a schematic diagram of Step S26 of the compensating method S20;

FIG. 20 illustrates a schematic diagram of Step S27 of the compensating method S20;

FIGS. 21A and 21B illustrate a schematic diagram of Step S28 of the compensating method S20;

FIGS. 25A and 25B illustrate photographs of a multiple chips module (MCM) before and after bonding the live dies to the compensated marked carrier;

FIG. 26 illustrates a schematic diagram of the multiple chips module (MCM) from the compensating method S20.

DETAILED DESCRIPTION OF THE INVENTION

Figures 1A, 1B:
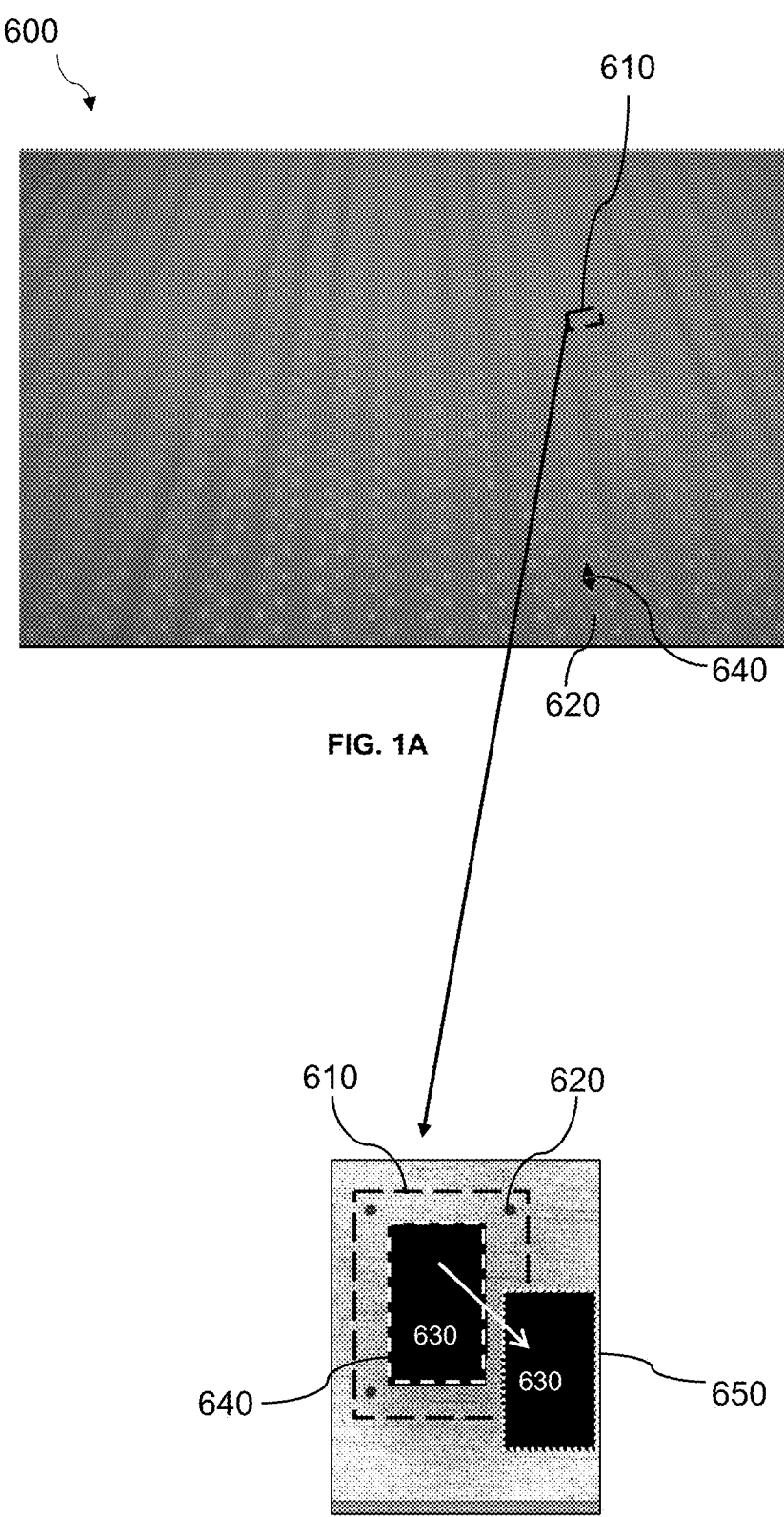
FIGS. 1A and 1B illustrate photographs of a traditional marked carrier.

FIG. 1A illustrates a photograph of a top side view of a traditional marked carrier 600 which can carry a number of semiconductor dies for multiple processes including compression molding. The traditional marked carrier 600 includes a number of marks 620 (as indicated by white dots in FIG. 1A) for providing locational information to precisely bond the semiconductor dies onto the traditional marked carrier 600. Four adjacent marks 620 at four corners define a bonding unit 610 for accommodating one or more semiconductor dies. The bonding unit 610 is indicated by a dashed rectangle in FIG. 1A. FIG. 1B illustrates a photograph of an enlarged top side view of the bonding unit 610. The four adjacent marks 620 are indicated by four black dots in at four corners of the bonding unit 610. A semiconductor die 630 is bonded at a bonded location 640 (as indicated by a white dashed rectangle) within the bonding unit 610. When going through the compression molding on the traditional marked carrier 600, the semiconductor die 630 would move as indicated by an arrow in FIG. 1B from the bonded location 640 to a shifted location 650 (as indicated by a white dotted rectangle) during the compression molding.

FIG. 2 illustrates a flow chart of a method S10 of fabricating a compensated marked carrier 108 according to an exemplary embodiment of the present disclosure. The method S10 includes Step S11, Step S13 and Step S15. The Step S11 is illustrated in FIGS. 3A and 3B.

Figure 3A:
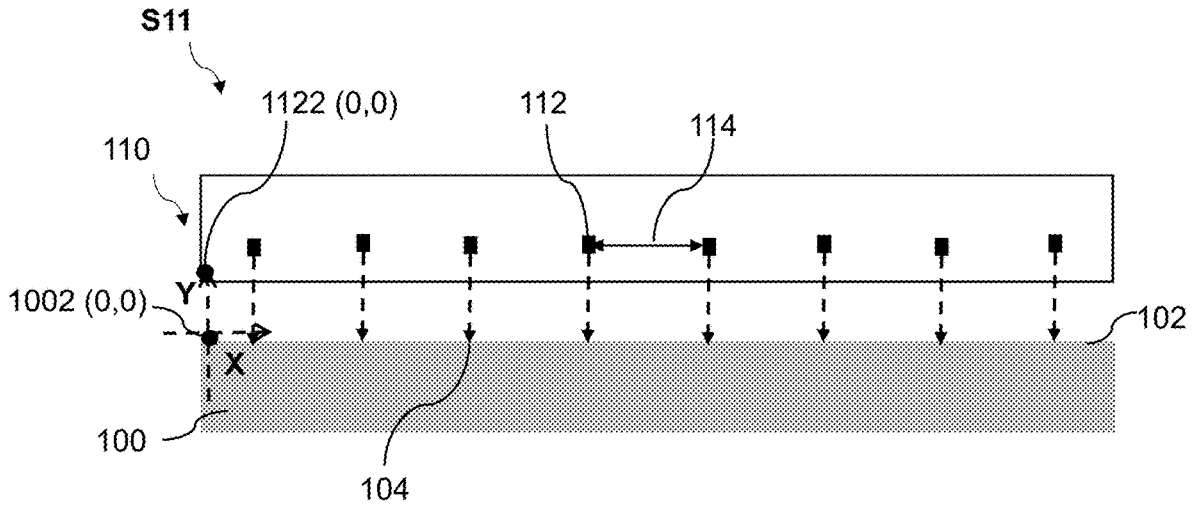
FIGS. 3A and 3B illustrate schematic diagrams of Step S11 of the method S10 according to FIG. 2.
Figure 3B:
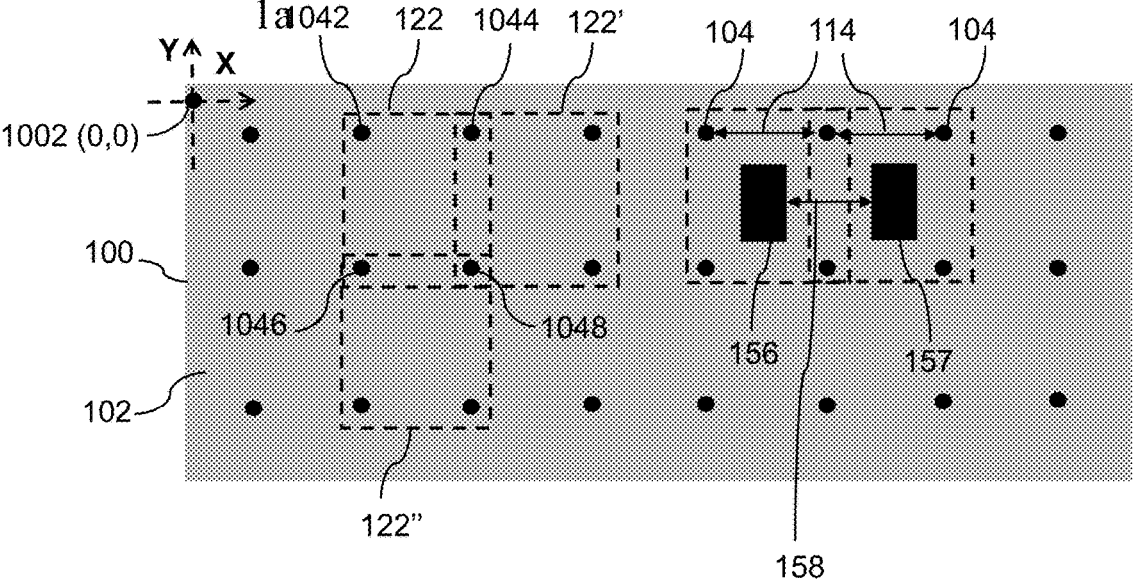

FIG. 3A shows a cross-sectional view of a portion of a blank carrier 100 and a schematic view of a computing apparatus 110. The blank carrier 100 has a rather flat front surface 102 without any observable markings or scores. The computing apparatus 110 such as a server can store a green file which includes information of the blank carrier 100 and distribution of original virtual carrier markings 112 on the blank carrier 100, as well as an original virtual distance 114 between two adjacent original virtual carrier markings 112.

According to the distribution of the original virtual carrier markings 112 stored in the computing apparatus 110, original projected markings 104 can be then determined on the front surface 102 of the blank carrier 100 through projection as indicated by dashed arrows in FIG. 3A. It is noted that the original projected markings 104 are also imaginary in nature and not physically made on the blank carrier 100; and the front surface 102 is still kept flat without observable markings or scores.

In an embodiment, the computing apparatus 110 generates a virtual fiducial 1122 as an origin (0,0) for a Cartesian coordinate system where the locations of the original virtual carrier markings 112 are represented by their respective coordinates (x, y) in the Cartesian coordinate system generated by the computing apparatus 110. Meanwhile, the blank carrier 100 has a carrier fiducial 1002 on the front surface 102. The carrier fiducial 1002 may be a feature of the blank carrier 100, such as an edge or a corner of the blank carrier 100. Alternatively, the carrier fiducial 1002 may be intentionally made on the front surface 102 of the blank carrier 100, such as a small spot made either temporarily or permanently. The carrier fiducial 1002 may be provided along with the blank carrier 100. Alternatively, the carrier fiducial 1002 may be made or found on the blank carrier 100 in the method S10. Then, by overlapping the virtual fiducial 1122 to the carrier fiducial 1002, the Cartesian coordinate system generated by the computing apparatus 110 is duplicated onto the front surface 102 of the blank carrier 100 where the carrier fiducial 1002 is used as an origin (0, 0) for the duplicated Cartesian coordinate system for the blank carrier 100. Then the respective coordinates (x, y) of the original virtual carrier markings 112 in the Cartesian coordinate system are retained the same as the coordinates (x, y) of the duplicated Cartesian coordinate system for the blank carrier 100 for indicating the locations of the original projected markings 104 on the front surface 102. In this way, the original virtual carrier markings 112 are projected as the original projected markings 104 onto the blank carrier 100 with the original virtual distance 114 retained the same as that between the adjacent original projected markings 104. It is understood that this method of projection is only an exemplary embodiment, and other similar ways of projection are also within the present disclosure.

FIG. 3B shows a top view of the portion of the blank carrier 100 and the original projected markings 104 projected from the original virtual carrier markings 112 stored in the computing apparatus 110 onto the blank carrier 100. Accordingly, the original virtual distance 114 between two adjacent original virtual carrier markings 112 stored in the computing apparatus 110 is retained the same as that between the two adjacent original projected markings 104 on the front surface 102 of the blank carrier 100. Then, an original bonding unit 122 defined by four adjacent original projected markings 1042-1048 (i.e., a first original projected marking 1042, a second original projected marking 1044, a third original projected marking 1046 and a fourth original projected marking 1048) is shown by a dashed rectangle in FIG. 3B. The original bonding unit 122 would accommodate one or more semiconductor dies. In order to save space on the blank carrier 100, the original projected markings 104 would be shared between adjacent original bonding units 122. It is shown that the original bonding units 122, 122' adjacent in a row share the second original projected marking 1044 and the fourth original projected marking 1048; and the original bonding units 122, 122'' adjacent in a column share the third original projected marking 1046 and the fourth original projected marking 1048. FIG. 3B shows that the portion of the blank carrier 100 has 8 columns and 3 rows of the original projected markings 104. Therefore, the portion of the blank carrier 100 has 2 rows of original bonding units 122 and 7 original bonding units 122 in the single row. In total, the portion of the blank carrier 100 has 14 original bonding units 122. This portion may represent other portions of the blank carrier 100 with the original projected markings 104 and the original bonding units 122. Preferably, the original projected markings 104 are evenly distributed and spaced apart by the same original virtual distance 114, so the original bonding units 122 are also evenly distributed on the blank carrier 100. Similar to the original projected markings 104, the original bonding units 122 are also imaginary in nature and not physically made on the blank carrier 100.

FIG. 3B shows that an original gap 158 would be identified between edges of two semiconductor dies 156, 157 if they were bonded to the two adjacent original bonding unit 122. The original gap 158 can be calculated from the original virtual distance 114 and dimensions of the semiconductor dies 156, 157. In an embodiment with even distribution of the original projected markings 104, if the semiconductor dies 156, 157 are located at a central location of their respective original bonding unit 122 and also have a same dimension, the original gap 158 can be calculated as a difference between the original virtual distance 114 minus a width of the semiconductor dies 156, 157.

Figure 4A:
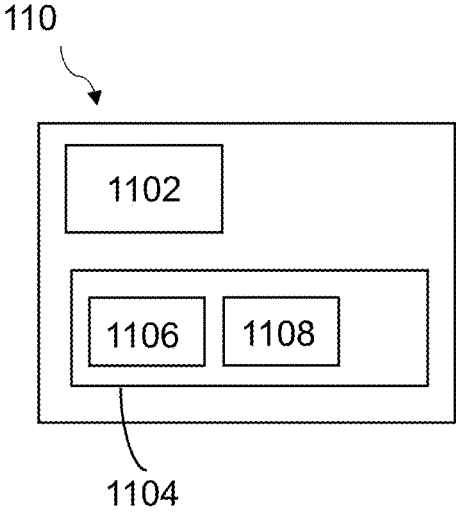
FIG. 4A illustrates a schematic diagram of a computing apparatus.
Figure 4B:
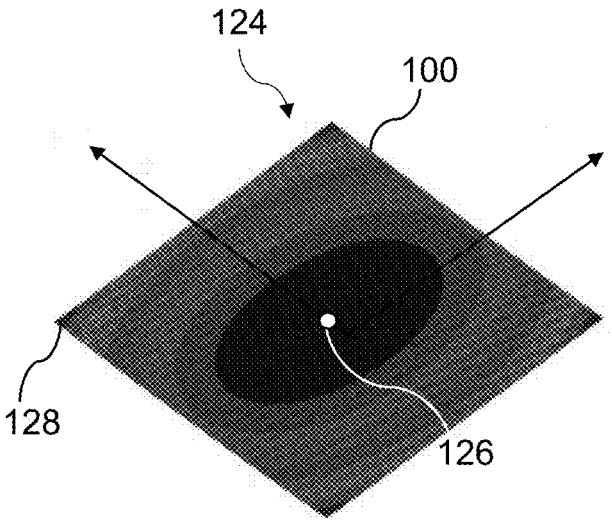
FIG. 4B illustrates a simulation plot of die displacement by the computing apparatus.

FIG. 4A illustrates a schematic diagram of the computing apparatus 110. The computing apparatus 110 includes a memory device 1102 for storing the green file, and a calculating device 1104 for adjusting the distribution of the original virtual carrier markings 112 and the corresponding original virtual distance 114 accordingly. In particular, the calculating device 1104 further includes a simulation algorithm 1106 for predicating the adjustment to the distribution of the original virtual carrier markings 112 and the corresponding original virtual distance 114. FIG. 4B illustrates a simulation plot 124 of die displacements by the simulation algorithm 1106. The simulation plot 124 shows that the further the semiconductor die is located away from center 126 of the simulation plot 124, the larger the semiconductor die would shift. Therefore, semiconductor dies at four corners 128 of the simulation plot 124 would have the greatest shift during the compression molding. Particularly, the simulation plot 124 shows that the shift of semiconductor dies is linear along the blank carrier 100 within a tolerance of accuracy, which means that the semiconductor dies would still be evenly distributed after the adjustment.

The simulation plot 124 shows that the original gap 158 between two adjacent semiconductor dies 156, 157 has a significant influence on the shift of the semiconductor dies 156, 157. For example, the original gap 158 may largely decide either expansion or contraction between the semiconductor dies 156, 157 during the compression molding. In a scenario of the expansion, the semiconductor dies 156, 157 tend to move outwardly away from the center 126 of the simulation plot 124 and also away from each other during the compression molding. On the contrary, in a scenario of the contraction, the semiconductor dies 156, 157 tend to move inwardly towards the center 126 of the simulation plot 124 and also towards each other during the compression molding. For another example, in the scenario of the expansion, the larger the original gap 158 is, the less the semiconductor dies 156, 157 would shift during the compression molding.

Figure 5A:
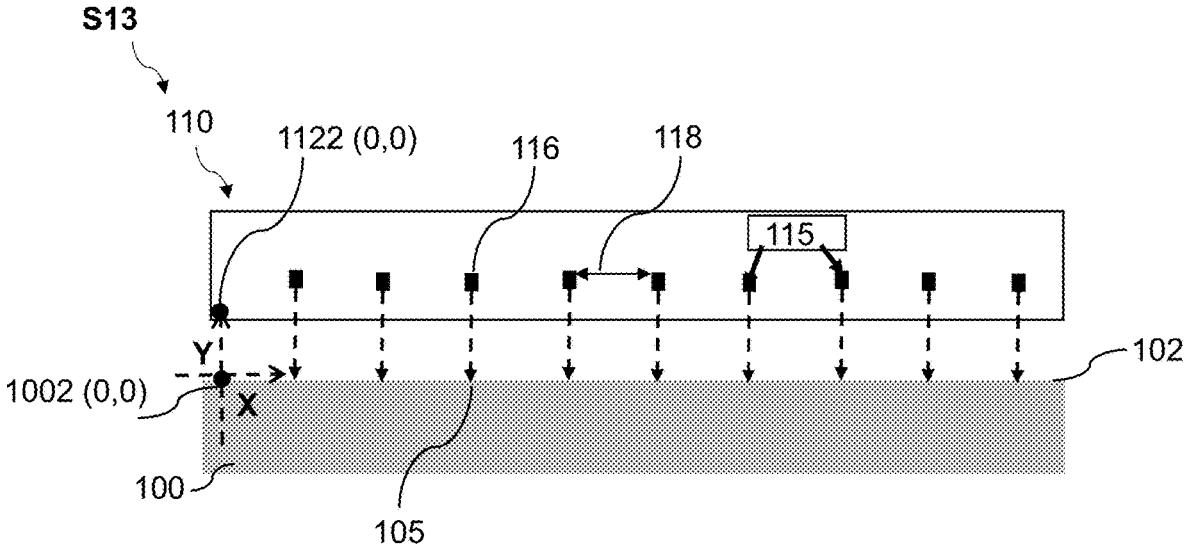
FIGS. 5A and 5B illustrate look-down camera Step S13 of the method S10 according to FIG. 2.
Figure 5B:
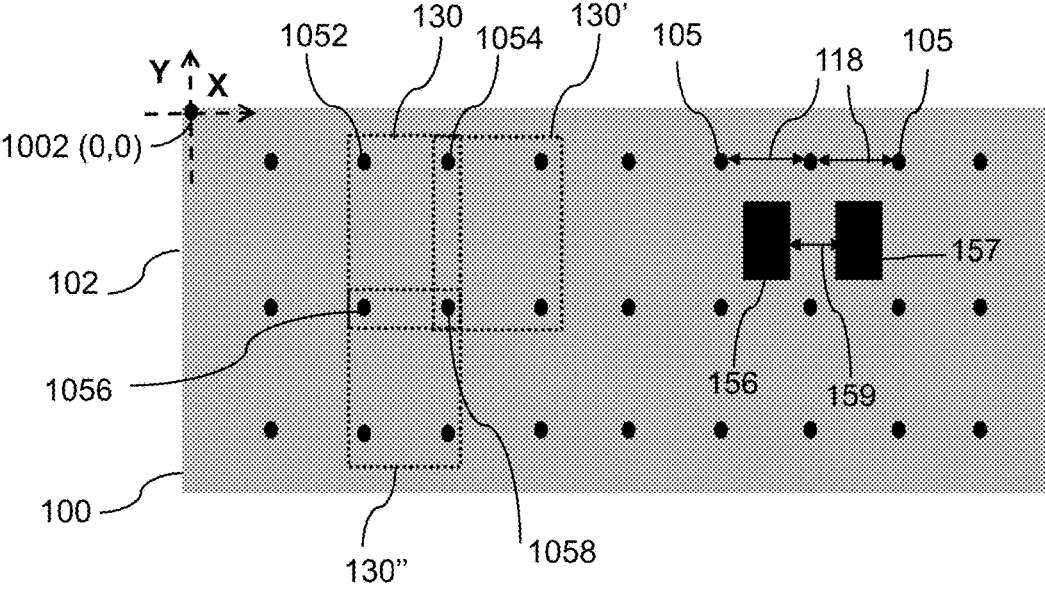

FIGS. 5A and 5B illustrate schematic diagrams of Step S13 of the method S10. The Step S13 is conducted by firstly calculating a compensation factor 115 by the simulation algorithm 1106 of the computing apparatus 110 from the simulation plot 124, and then applying the compensation factor 115 to the original virtual carrier markings 112 to transform the original virtual carrier markings 112 to compensated virtual carrier markings 116; and the original virtual distance 114 between two adjacent original virtual carrier markings 112 is transformed to a compensated virtual distance 118 between two adjacent compensated virtual carrier markings 116 accordingly in the computing apparatus 110. The compensation factor 115 is calculated depending on multiple parameters, but primarily the original gap 158 between the two adjacent semiconductor dies 156, 157.

FIG. 5A shows a schematic view of the compensated virtual carrier markings 116 in the computing apparatus 110 in the scenario of the expansion during the compression molding. In order to balance against the expansion, before the compression molding the original virtual distance 114 is reduced to the compensated virtual distance 118 by the application of the compensation factor 115, i.e., the compensated virtual distance 118 is made smaller than the original virtual distance 114. Accordingly, the computing apparatus 110 could generate more compensated virtual carrier markings 116 than the original virtual carrier markings 112 for the same portion of the blank carrier 100. For example, FIG. 5A shows 9 compensated virtual carrier markings 116 in a single row, compared with 8 original virtual carrier markings 112 shown in FIG. 3A. Then the compensated virtual carrier markings 116 are projected as compensated projected markings 105 on the front surface 102 as indicated by dashed arrows in FIG. 5A. The projection of compensated virtual carrier markings 116 to form the compensated projected markings 105 may be conducted in the same way as the projection of the original virtual carrier markings 112 to form the original projected markings 104 by overlapping the virtual fiducial 1122 in the computing apparatus 110 to the carrier fiducial 1002 on the front surface 102 and then by duplicating the Cartesian coordinate system of the computing apparatus 110 to the blank carrier 100. It is noted that the compensated projected markings 105 are imaginary in nature and not physically made on the blank carrier 100; and the front surface 102 is still rather flat without observable markings or scores. Due to the smaller compensated virtual distance 118, the semiconductor dies are more closely bonded with the application of the compensation factor 115; and the portion of the blank carrier 100 could carry more dies for the compression molding and the subsequent processes.

While in the scenario of the contraction, the compensation factor 115 is applied to increase the original virtual distance 114 to a compensated virtual distance 118' (not shown) before the compression molding, i.e. the compensated virtual distance 118' is made larger than the original virtual distance 114, in order to balance against the contraction during the compression molding. It is particularly important to offset the contraction for manufacturing a six-sided fan-in semiconductor package where its package profile is just slightly larger than that of the semiconductor die embedded therein. Otherwise, if a package gap between the six-sided fan-in semiconductor packages is too small, particularly smaller than the width of a saw blade during a singulation process, the semiconductor dies packaged inside the six-sided fan-in semiconductor packages may be damaged during the singulation process by the saw blade. The following drawings describe the scenario of the expansion during the compression molding for the present disclosure, but it is understood that the present disclosure is also applicable to the scenario of the contraction during the compression molding.

Accordingly, the original gap 158 between two adjacent semiconductor dies 156, 157 would change with the application of the compensation factor 115 for adjusting the original virtual carrier markings 112 and the original virtual distance 114 to the compensated virtual carrier markings 116 and the compensated virtual distance 118 respectively. The transformation makes the original virtual distance 114 to either the smaller compensated virtual distance 118 (for the expansion) or the larger compensated virtual distance 118' (for the contraction). Then during the compression molding, due to the expansion or the contraction, the compensated gap 159 would either increase or decrease and return to the original gap 158 as designed in the green file and stored in the computing apparatus 110. Meanwhile, the simulation plot 124 also shows that the shift of the semiconductor dies is linear during the compression molding; and therefore, the semiconductor dies after molding are still evenly distributed, and the same original gap 158 is restored between every two adjacent molded semiconductor dies. In short, specifications in the green file for the semiconductor packages are retained regardless of whether the semiconductor dies expand or contract during the compression molding.

FIG. 5B shows a top view of the portion of the blank carrier 100 and the compensated projected markings 105 on the blank carrier 100. Similarly, the compensated virtual distance 118 between the two adjacent compensated virtual carrier markings 116 in the computing apparatus 110 is the same as that between the two adjacent compensated projected markings 105 on the front surface 102 of the blank carrier 100 after the projection. Similarly, a compensated bonding unit 130 defined by four adjacent compensated projected markings 1052-1058 (i.e., a first compensated projected marking 1052, a second compensated projected marking 1054, a third compensated projected marking 1056 and a fourth compensated projected marking 1058) is shown by a dotted rectangle in FIG. 5B. The compensated bonding unit 130 would accommodate one or more semiconductor dies. Similarly, the compensated bonding units 130, 130' adjacent in a row share the second compensated projected marking 1054 and the fourth compensated projected marking 1058; and the compensated bonding units 130, 130" adjacent in a column share the third compensated projected marking 1056 and the fourth compensated projected marking 1058. Since the compensated virtual distance 118 is smaller than the original virtual distance 114, more compensated projected markings 105 can be projected in a single row onto the blank carrier 100; and accordingly, more compensated bonding unit 130 can also be imaginarily drawn on the portion of the blank carrier 100 for accommodating more semiconductor dies. Similar to the compensated projected markings 105, the compensated bonding unit 130 are also imaginary in nature and not physically made on the blank carrier 100.

FIG. 5B also shows a compensated gap 159 between edges of the semiconductor dies 156, 157 if they were bonded to the two adjacent compensated bonding unit 130. Similarly, the compensated gap 159 can be calculated from the compensated virtual distance 118 and dimension of the semiconductor dies 156, 157. In an embodiment with even distribution of the compensated projected markings 105, if the semiconductor dies 156, 157 are located at a central location of their respective compensated bonding unit 130 and also have a same dimension, the compensated gap 159 can be calculated as a difference between the compensated virtual distance 118 minus the width of the semiconductor dies 156, 157.

For either the expansion or the contraction, the compression molding would lead to misalignment of the semiconductor dies and cause problems to subsequent processes. The present disclosure overcomes this issue by transforming the original projected markings 104 to the compensated projected markings 105 on the blank carrier 100 with the application of the compensation factor 115, in order to change the original virtual distance 114 to the compensated virtual distance 118 and thereby to compensate the original gap 158 to the compensated gap 159 between the adjacent semiconductor dies 156, 157. During the compression molding, the expansion or the contraction between the adjacent semiconductor dies 156, 157 would be offset by the compensation of the compensated gap 159; and therefore, the original gap 158 of the green file is restored between the adjacent semiconductor dies 156, 157 from the compensated gap 159 before the compression molding. As described above, the transformation of the original projected markings 104 to the compensated projected markings 105 may be conducted by first transforming the original virtual carrier markings 112 to the compensated virtual carrier markings 116 in the computing apparatus 110; and then projecting the compensated virtual carrier markings 116 onto the blank carrier 100 as the compensated projected markings 105; while the compensated virtual distance 118 is kept the same as that between the two adjacent compensated projected markings 105.

Figures 6A, 6B, 6C, 6D:
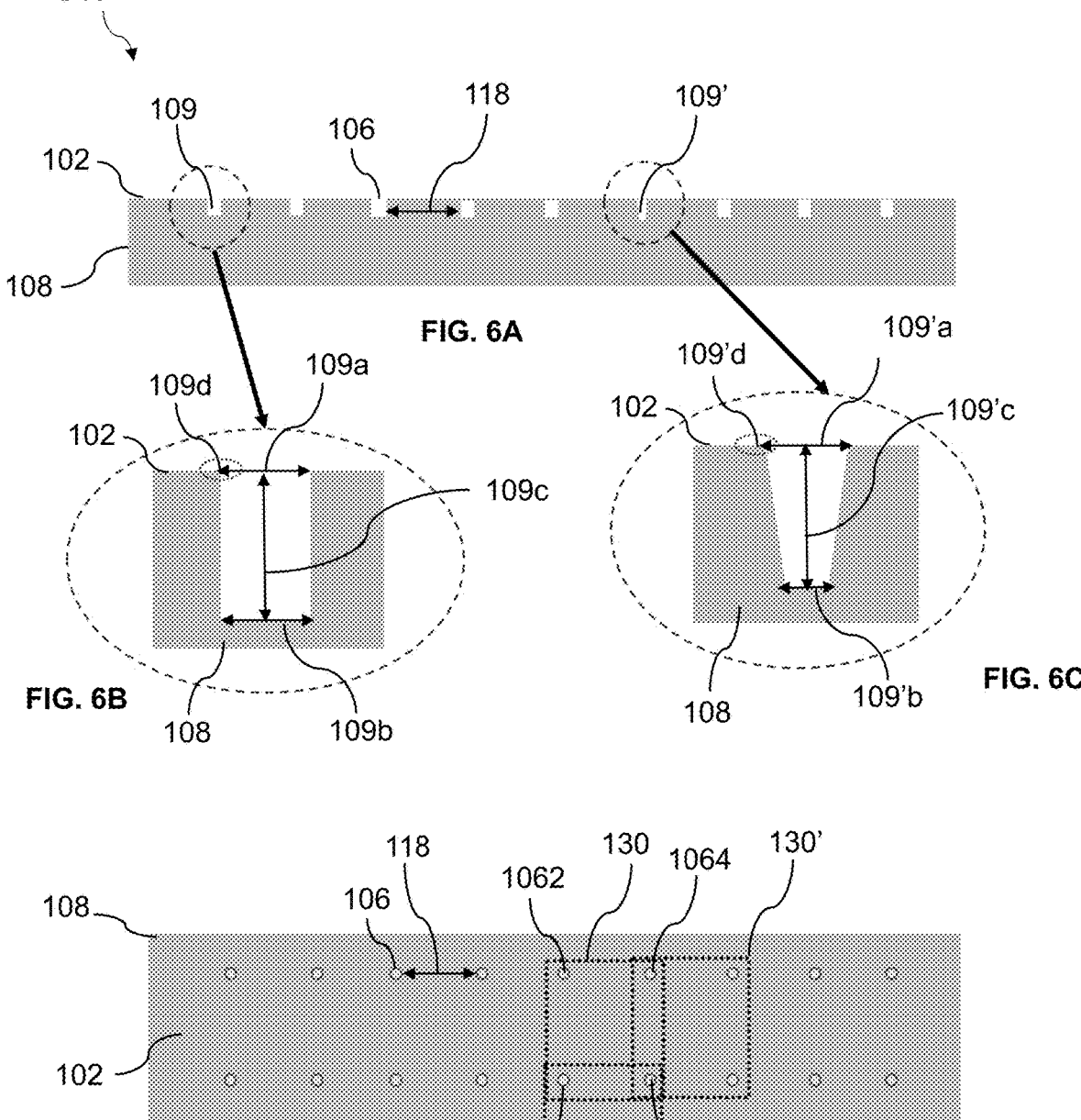
FIGS. 6A to 6D illustrate schematic diagrams of Step S15 of the method S10 according to FIG. 2.

FIGS. 6A to 6D illustrate schematic diagrams of the Step S15 of the method S10 according to FIG. 2, i.e., making physical carrier markings 106 on the front surface 102 of the blank carrier 100 at the compensated projected markings 105 in order to fabricate the compensated marked carrier 108. Preferably, the physical carrier markings 106 are precisely made within a tolerance of 3 micrometer (μm) to the compensated projected markings 105. FIG. 6A shows a cross-sectional view of a portion of the compensated marked carrier 108 with the physical carrier markings 106 according to the portion of the blank carrier 100 as shown in FIG. 5A. Since the physical carrier markings 106 are made at the compensated projected markings 105, the compensated virtual distance 118 is kept the same as that between two adjacent physical carrier markings 106 on the compensated marked carrier 108.

The physical carrier markings 106 may be made permanently on the front surface 102 as grooves by any known technologies, such as laser drilling, mechanical drilling, chemical etching, or their combination where they cannot be cased without removing the front surface 102. In an embodiment, the physical carrier markings 106 may be in a form of a cylindrical groove 109. FIG. 6B shows an enlarge cross-sectional view of the cylindrical groove 109 with a rectangular shape. Therefore, the cylindrical groove 109 has a same circular area for its top surface 109A and bottom surface 109B with a diameter of around 0.15 millimeters (mm) and a depth 109c in a range of 0.02 to 0.06 millimeters (mm). Preferably, the depth 109c of the cylindrical groove 109 is around 0.025 millimeters (mm). In particular, the cylindrical groove 109 has an edge 109d (as indicated by a dotted circle in FIG. 6B) without burr on the front surface 102 so that the physical carrier markings 106 can be precisely identified before bonding the semiconductor dies to the compensated marked carrier 108.

In another embodiment, the physical carrier markings 106 may be in a form of a truncated groove 109'. FIG. 6C shows an enlarge cross-sectional view of the truncated groove 109' with a trapezoid shape. Therefore, a top surface 109'a of the truncated groove 109' has a larger circular area than that of the bottom surface 109'b. In a preferred embodiment, an area ratio of the bottom surface 109'b to the top surface 109'a is in a range of 60% to 90%. For example, if the top surface 109'a has a diameter of 0.15 millimeters (mm), the bottom surface 109'b would have a diameter in a range of 0.09 to 0.135 millimeters (mm). The truncated groove 109' may have a depth 109'c in a range of 0.02 to 0.06 millimeters (mm). Preferably, the depth 109'c of the truncated groove 109' is around 0.025 millimeters (mm). Similarly, the truncated groove 109' has an edge 109'd (as indicated by a dotted circle in FIG. 6D) without burr on the front surface 102 so that the physical carrier markings 106 can be precisely identified before bonding the semiconductor dies to the compensated marked carrier 108.

Alternatively, the physical carrier markings 106 may be made temporarily where they can be erased while the front surface 102 is kept intact, such as by painting or other similar known technologies. After the compression molding, the physical carrier markings 106 may be removed by chemical washing without damaging the front surface 102 of the compensated marked carrier 108. Meanwhile, in order to resist a high pressure during the compression molding, the compensated marked carrier 108 (also the blank carrier 100) may be made of a material having a large Young's Modulus to prevent warpage during the compression molding. In one embodiment, the compensated marked carrier 108 is made of Alloy 46 with a Young's Modulus of around 137.5 Gigapascal (GPa). The compensated marked carrier 108 has a carrier thickness in accordance to that of the semiconductor dies. If the compensated marked carrier 108 is too thin, it would not have enough rigidity to support the semiconductor dies bonded thereon and also may have warpages during the compression molding; while the compensated marked carrier 108 cannot be too thick, otherwise it would be too cumbersome to be dealt with in the compression molding and the subsequent processes. The carrier thickness is also dependent on the material. For example, when the compensated marked carrier 108 is made of Alloy 46, the carrier thickness may be around 2.2 millimeters (mm) if the semiconductor dies have a thickness of around 0.35 millimeter (mm).

FIG. 6D shows a top view of the portion of the compensated marked carrier 108 with the physical carrier markings 106. Since the physical carrier markings 106 are made at the compensated projected markings 105, the compensated bonding unit 130 can also be found on the compensated marked carrier 108. It is noted that the compensated bonding unit 130 are also imaginary in nature and not physically made on the compensated marked carrier 108. The compensated bonding unit 130 is defined by four adjacent physical carrier markings 1062-1068 (i.e., a first physical carrier markings 1062, a second physical carrier marking 1064, a third physical carrier marking 1066 and a fourth physical carrier marking 1068) for accommodating one or more semiconductor dies. Following FIG. 5B, the compensated bonding units 130, 130' adjacent in a row share the second physical carrier marking 1064 and the fourth physical carrier marking 1068; and the compensated bonding units 130, 130" adjacent in a column share the third physical carrier marking 1066 and the fourth physical carrier marking 1068. In consistence with FIG. 5B, the portion of the compensated marked carrier 108 can also be divided into 8 compensated bonding units 130 in a single row.

FIG. 7 illustrates a flow chart of a compensating method S20 for performing the compression molding to a panel-level semiconductor process, following the method S10 as illustrated in FIG. 2 of fabricating the compensated marked carrier 108 with the physical carrier markings 106. The compensating method S20 includes Step S21 to S29.

Figure 8A:
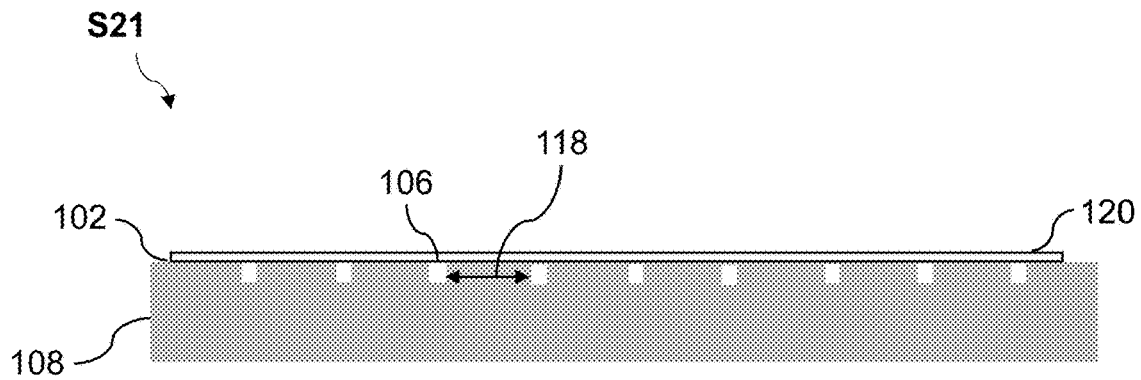
FIGS. 8A to 8C illustrate schematic diagrams of Step S21 of the compensating method S20.
Figure 8B:
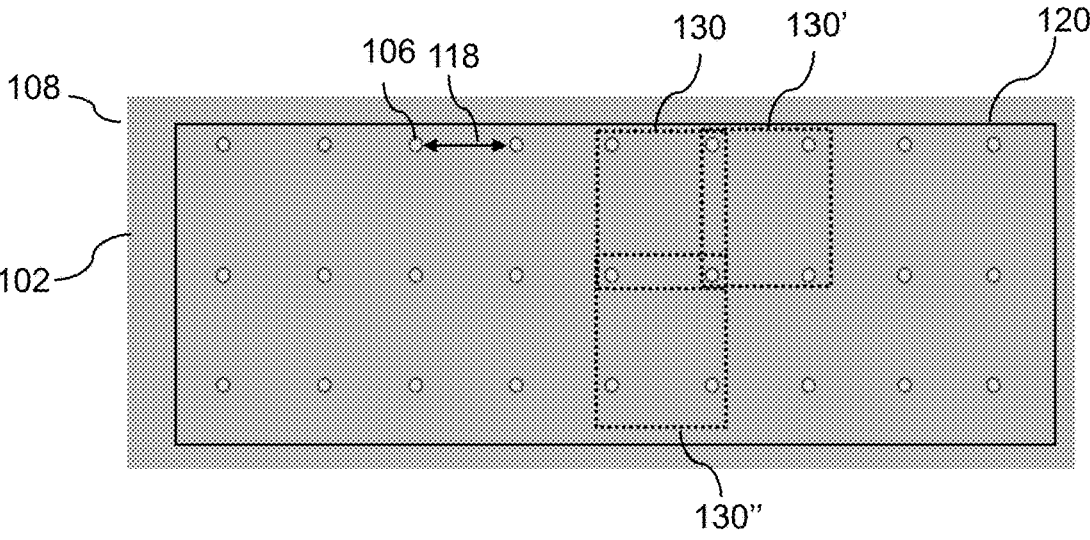

The Step S21 is illustrated in FIGS. 8A and 8B and conducted by applying a heat release tape (also called thermal release tape) 120 onto the front surface 102 of the compensated marked carrier 108. FIG. 8A shows a cross-sectional view that the heat release tape 120 covers the physical carrier markings 106; and FIG. 8B shows a top view that the heat release tape 120 covers the compensated bonding unit 130. The heat release tape 120 on the one hand can be secured to the front surface 102 of the compensated marked carrier 108; and on the other hand, can secure the semiconductor dies. However, the adhesion of the heat release tape 120 is not strong enough for holding the semiconductor dies firmly in place during the compression molding; and the semiconductor dies would shift in either the scenario of the expansion or the scenario of the contraction as described above.

Figure 8C:
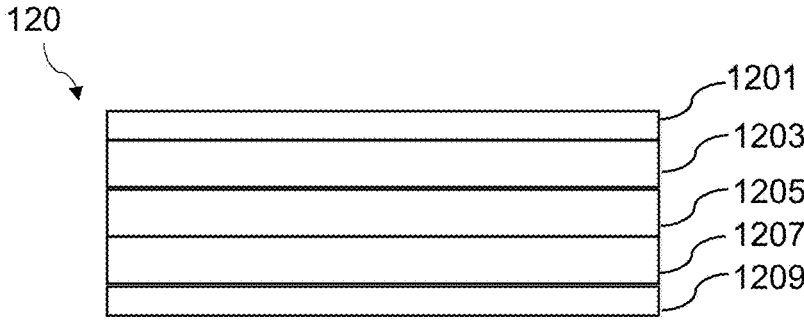

The heat release tape 120 may have various structures as long as it can fulfill the purpose of adhesion. For example, the heat release tape 120 may be a double-sided adhesive tape having a single polymeric layer with adhesives on both two sides of the single polymeric layer. In an embodiment, the heat release tape 120 has a laminated structure of multiple layers as shown in FIG. 8C, with a first liner 1201, foaming adhesive 1203 for securing the heat release tape 120 on the front surface 102, a polyester film 1205 for providing a structural support, a base adhesive 1207 for securing the semiconductor dies on the heat release tape 120, and a second liner 1209. Preferably, the heat release tape 120 is to be transparent or semi-transparent so that the physical carrier markings 106 can be still seen or detectable. In a preferred embodiment, the heat release tape 120 is transparent under a specific light with a wavelength of 600 nm. The heat release tape 120 may have a thickness in accordance with that of semiconductor dies. For example, the thickness of the heat release tape 120 may be around 0.1 millimeter (mm) when the semiconductor dies have a thickness of around 0.35 millimeter (mm).

Figure 9A:
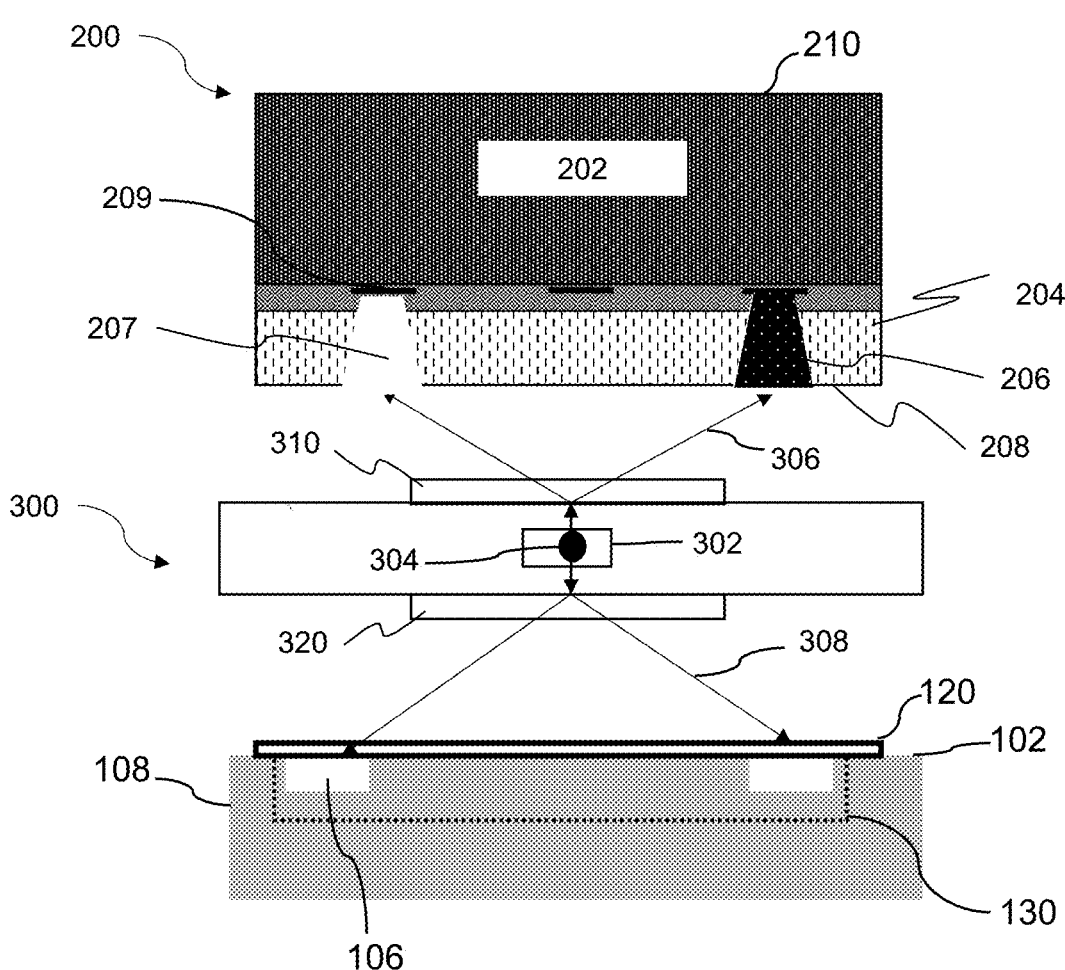
FIG. 9A illustrates a schematic diagram of an embodiment of a vision apparatus for aligning the live dies onto the compensated marked carrier.

Then the semiconductor dies would be bonded at their respective locations on the compensated marked carrier 108. In order to be bonded precisely, the semiconductor dies are aligned to their respective locations before being bonded onto the compensated marked carrier 108. FIG. 9 shows a cross-sectional view of aligning a live die 200 to the compensated marked carrier 108 for precisely bonding the live die 200 to its compensated bonding unit 130. The live die 200 performs an active electronic function in the semiconductor packages. In an embodiment, the live die 200 has a Silicon die 202, a protective layer 204 applied on an active surface 208 of the live die 200, and filled-vias 206 formed through the protective layer 204 for electrically leading out die pads 209 from the active surface 208. The filled-vias 206 are formed by filling conductive materials into pre-vias 207 in the protective layer 204. The filled-vias 206 may not be formed in this step and the die pads 209 would be exposed from the pre-vias 207. As exposed from the protective layer 204, the filled-vias 206 or the die pads 209 could be used as special features to identify the live die 200 during the alignment of the live die 200 to the compensated marked carrier 108. A vision apparatus 300 is used to identify the exposed filled-vias 206 for the live die 200 and the physical carrier markings 106 on the compensated marked carrier 108 to determine relative position and orientation of the live die 200 to the compensated marked carrier 108. Preferably, the identification of the live die 200 and that of the compensated marked carrier 108 are performed simultaneously to bond the live die 200 more precisely at its bonding location within the compensated bonding unit 130.

In one embodiment, the vision apparatus 300 has a look-up camera assembly 310 and a look-down camera assembly 320 for simultaneously identify the exposed filled-vias 206 (or the die pads 209 through the pre-vias 207) and the physical carrier markings 106 respectively when the vision apparatus 300 is inserted between the live die 200 and the compensated marked carrier 108. Once aligned, the vision apparatus 300 is withdrawn; and the live die 200 is lowered down towards the compensated marked carrier 108 vertically and finally bonded to the heat release tape 120 and the front surface 102 of the compensated marked carrier 108. In some embodiments, the look-up camera assembly 310 and the look-down camera assembly 320 are disposed in a vertical co-axis configuration for avoiding any misalignment that may be caused by the vision apparatus 300 itself. An alignment light 304 is emitted from a single light source 302 and then divided into a look-up beam 306 and a look-down beam 308 into the look-up camera assembly 310 and the look-down camera assembly 320 respectively. As a result, the look-up camera assembly 310 and the look-down camera assembly 320 can simultaneously identify the live die 200 and its corresponding compensated bonding unit 130 on the compensated marked carrier 108. The look-up camera assembly 310 and the look-down camera assembly 320 have high resolution collinear camera units for precisely determining the locations of the live dies 200 and the compensated bonding unit 130 respectively.

Figure 9B:
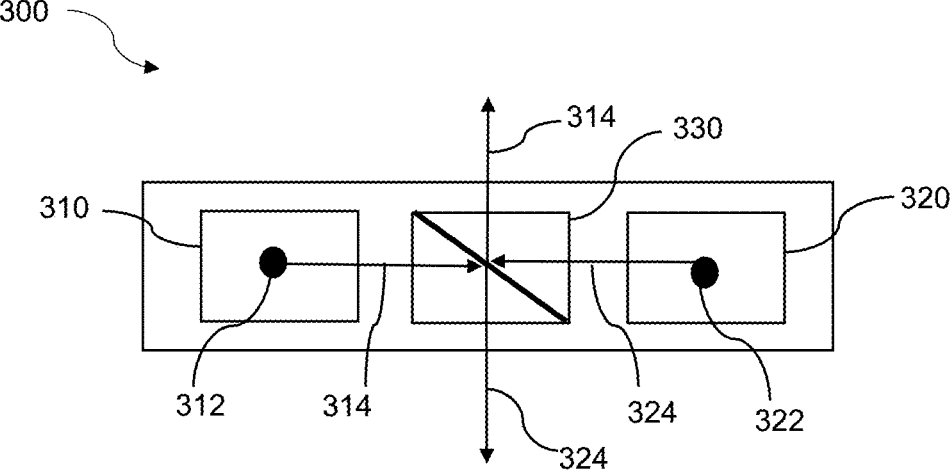
FIG. 9B illustrates a schematic diagram of another embodiment of the vision apparatus.

In another embodiment, the look-up camera assembly 310 and the look-down camera assembly 320 are arranged in a side-by-side configuration for the vision apparatus 300. FIG. 9B shows a cross-sectional view of the vision apparatus 300 of the side-by-side configuration. The look-up camera assembly 310 and the look-down camera assembly 320 has a first light source 312 for emitting a first alignment light 314 and a second light source 322 for emitting a second alignment light 324 respectively. Since the first light source 312 and the second light source 322 are independent to each other, the first alignment light 314 and the second alignment light 324 are also distinct to each other. The first alignment light 314 and the second alignment light 324 are controlled to reach a prism 330 and then reflected upwardly and downwardly respectively. Therefore, the look-up camera assembly 310 and the look-down camera assembly 320 arranged in the side-by-side configuration can also simultaneously identify the live die 200 and its corresponding compensated bonding unit 130 on the compensated marked carrier 108. Compared with the vertical co-axis configuration which can only emit the alignment light 304, the side-by-side configuration can independently emit the first and the second alignment lights 314, 324 which could be more suitable for their respective purposes. For example, the first alignment light 314 can be specifically selected according to conductive materials filled in the filled-vias 206 (or the die pads 209); while the second alignment light 324 can be selected with a specific wavelength (such as 600 nm) to penetrate the heat release tape 120 in order to detect the physical carrier markings 106 covered by the heat release tape 120.

Figures 10A, 10B, 10C:
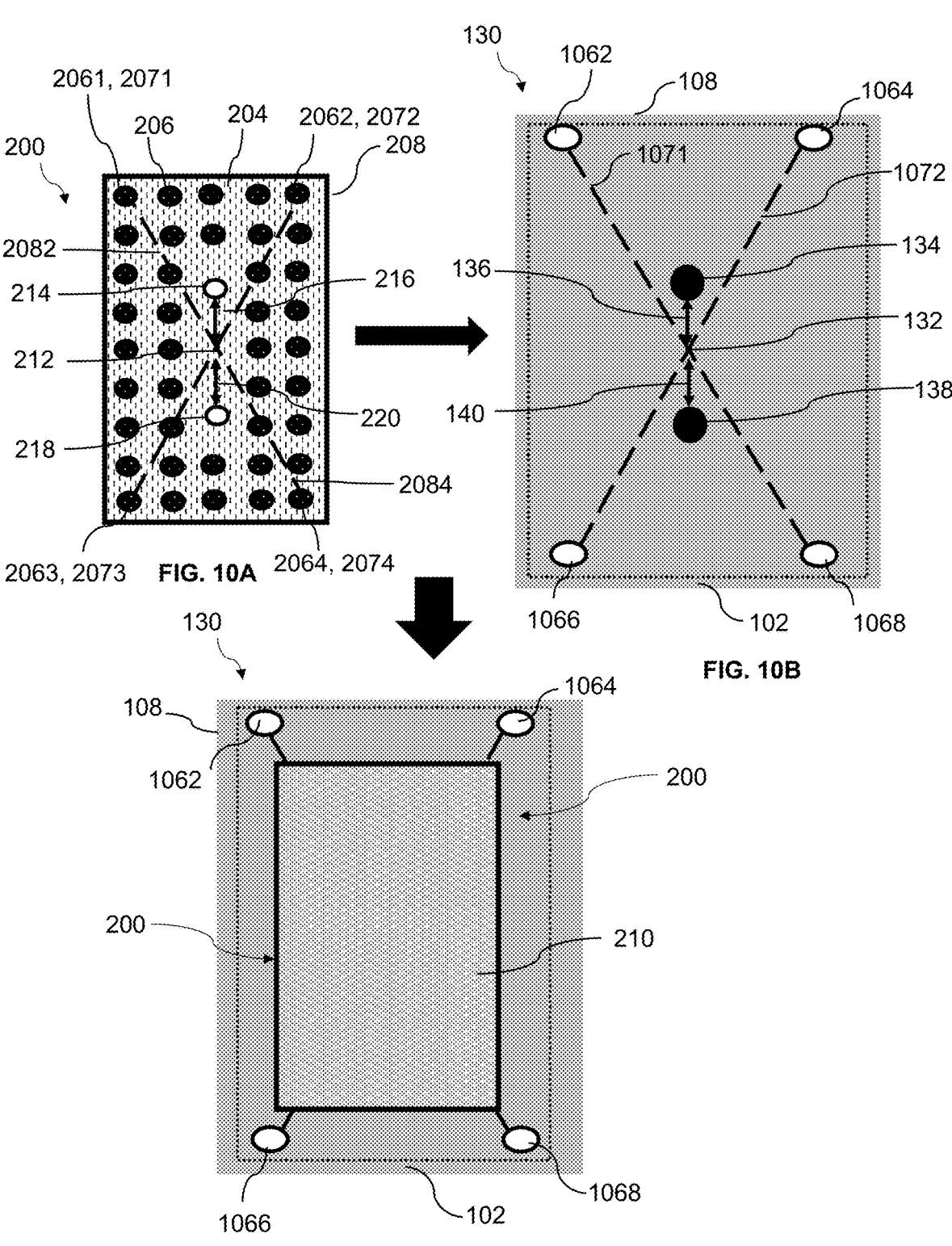
FIGS. 10A to 10C illustrate schematic diagrams of a method of aligning the live die to the compensated bonding unit.

FIGS. 10A to 10C illustrate schematic diagrams of a method of aligning the live die 200 to the compensated bonding unit 130 on the compensated marked carrier 108.

FIG. 10A shows a top view of the live die 200 from the active surface 208. Four filled-vias 2061-2064 (i.e., a first filled-via 2061, a second filled-via 2062, a third filled-via 2063 and a fourth filled-via 2064) or four pre-vias 2071-2074 (i.e., a first pre-via 2071, a second filled-via 2072, a third pre-via 2073 and a fourth pre-via 2074) are firstly identified at four corners of the live die 200; and then a first diagonal virtual line 2082 is drawn between the first filled-via 2061 (or the first pre-via 2071) at the left upper corner and the fourth filled-vias 2064 (or the fourth pre-vias 2074) at the right lower corner; and a second diagonal virtual line 2084 is drawn between the second filled-via 2062 (or the second pre-vias 2072) at the right upper corner and third the filled-via 2063 (or the third pre-vias 2073) at the left lower corner. A virtual die center 212 is determined at an intersectional point of the first and the second diagonal virtual lines 2082, 2084; and then a first virtual die reference point 214 and a second virtual die reference point 218 are determined by shifting a first die distance 216 and a second die distance 220 away from the virtual die center 212. It is understood that the first and the second virtual die reference points 214, 218 are arbitrarily determined and may be at any locations away from the virtual die center 212 by the first and the second die distance 216, 220. For example, the first and the second virtual die reference point 214, 218 may be turned clockwise or anti-clockwise by 90 degrees from their locations as shown in FIG. 10A. Preferably, the first and the second virtual die reference points 214, 218 are opposed to each other with a same shift away from the virtual die center 212, i.e., the first die distance 216 equals to the second die distance 220. It is understood that the first and the second diagonal virtual lines 2082, 2084 may be drawn between other filled-vias 206 (or other pre-vias 207) to determine the virtual die center 212 and further the first and the second virtual die reference points 214, 218.

FIG. 10B shows a top view of the compensated bonding unit 130 on the compensated marked carrier 108. Four physical carrier markings 1062-1068 are firstly identified at four corners of the compensated bonding unit 130; and then a first diagonal virtual line 1071 is drawn between the first physical carrier marking 1062 at the left upper corner and the fourth physical carrier marking 1068 at the right lower corner; and a second diagonal virtual line 1072 is drawn between the second physical carrier marking 1064 at the right upper corner and the third physical carrier marking 1066 at the left lower corner. A virtual carrier center 132 is determined at an intersectional point of the first and the second diagonal virtual lines 1071, 1072; and then a first virtual carrier reference point 134 and a second virtual carrier reference point 138 are determined by shifting a first carrier distance 136 and a second carrier distance 140 from the virtual carrier center 132. It is understood that the first and the second virtual carrier reference point 134, 138 are determined in accordance to the first and the second virtual die reference point 214, 218 in order to precisely align the live die 200 to its compensated bonding unit 130. It is also understood that the first and the second diagonal virtual lines 1071, 1072 may be drawn in other ways, in consistence with the ways the first and the second diagonal virtual lines 2082, 2084 are drawn for the live die 200.

Then, the alignment of the live die 200 to the compensated bonding unit 130 is conducted by aligning the first virtual die reference point 214 and the second virtual die reference point 218 to the first virtual carrier reference point 134 and the second virtual carrier reference point 138 respectively, so that the live die 200 are bonded in a face-down manner, i.e., the active surface 208 would be in contact with the front surface 102 of the compensated marked carrier 108. FIG. 10C shows a top view of the live die 200 bonded onto the compensated marked carrier 108. The live die 200 is located precisely at its bonding location within the compensated bonding unit 130; and a back surface 210 of the live die 200 faces away from the compensated marked carrier 108. The four physical carrier markings 1062-1068 may be either exposed or covered by the live die 200 depending on the size of the live die 200. Preferably, the four physical carrier markings 1062-1068 are exposed for checking the location of the live die 200 after being bonded to the compensated marked carrier 108.

Figure 11A:
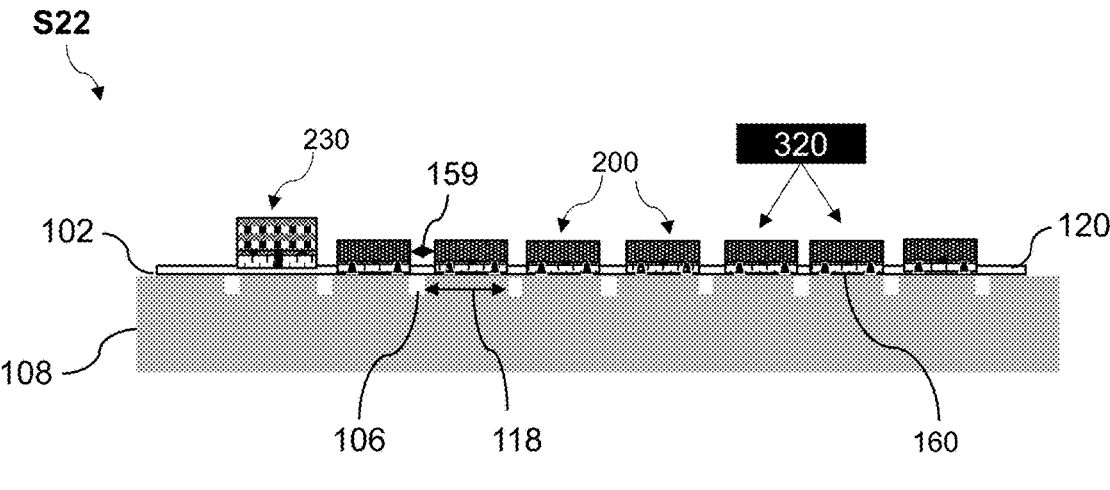
FIGS. 11A and 11B illustrate schematic diagrams of the live dies and a reference die bonded on the compensated marked carrier.
Figure 11B:
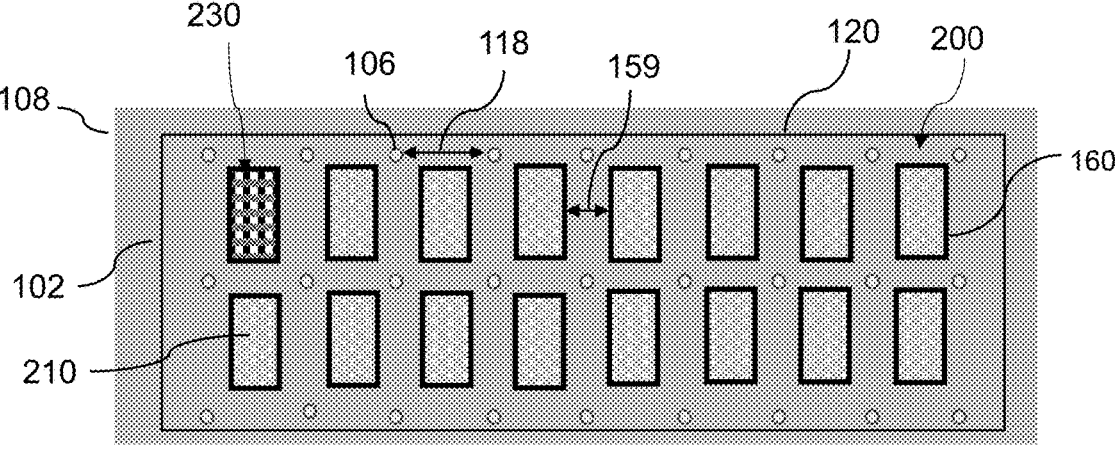

FIGS. 11A and 11B respectively shows a cross-sectional view and a top view of the live dies 200 and a reference die 230 bonded on the compensated marked carrier 108. The reference die 230 may be different from the live dies 200 in order to be easily detectable by the vision apparatus 300. But it is also understood that one of the live dies 200 may be also used as the reference die 230. After the precise alignment as described above, the live dies 200 are bonded to their respective bonded location 160 on the compensated marked carrier 108. FIGS. 11A and 11B shows the compensated gap 159 between two adjacent live dies 200 bonded on the compensated marked carrier 108 before going through the compression molding.

In the scenario of the expansion, the compensated gap 159 is smaller than the original gap 158 for the bonded live dies 200 before the compression molding; and the compensated gap 159 would increase back to the original gap 158 after the compression molding. As a result, more lives dies 200 could be bonded onto the compensated marked carrier 108 for the compression molding and subsequent processes; and a higher production efficiency would be achieved. While in the scenario of the contraction, the compensated gap 159 is larger than the original gap 158 for the bonded live dies 200 before the compression molding; and the compensated gap 159 would decrease back to the original gap 158 after the compression molding. If the original gap 158 was not compensated, the contraction during the compression molding would significantly decrease the original gap 158 such that the lives dies 200 would be so closely distributed that the following singulation process would unavoidably damage the live dies 200. However, by means of compensation, the original gap 158 would be restored after compression molding which would facilitate the subsequent singulation process.

In short, the original design of the semiconductor packages in the green file could be restored by compensating the original gap 158 into the compensated gap 159 in the computing apparatus 110 by either increasing the original gap 158 in the scenario of contraction or decreasing the original gap 158 in the scenario of expansion. As described above, the compensation of the original gap 158 is conducted by transforming the original virtual carrier markings 112 and the original virtual distance 114 to the compensated virtual carrier markings 116 and the compensated virtual distance 118 accordingly in the computing apparatus 110 with the application of the compensation factor 115. Then, the physical carrier markings 106 are created based on the compensated projected markings 105 which is projected from the compensated virtual carrier markings 116. This ensures that when the live dies 200 are bonded to the compensated marked carrier 108, the original gap 158 is adjusted to the compensated gap 159 to offset any expansion or contraction during compression molding.

FIGS. 12A and 12B illustrates Step S23 of the compensating method S20, i.e., performing the compression molding for forming a molded panel 242 in which the live dies 200 and the reference dies 230 are encapsulated inside a molding layer 240. The compression molding is conducted at a high temperature (such as at around 140° C.) and at a high pressure (such as at around 6 Megapascal (MPa)) with a molding compound. The compensated marked carrier 108 may expand during compression molding, but this expansion is homogeneous or linear along the compensated marked carrier 108. Accordingly, the influence of the expansion can be accounted for when determining the compensation factor 115 using the simulation plot 124. Meanwhile, the compensated marked carrier 108 may be made of a material having a very low Coefficient of Thermal Expansion (CTE) for minimizing the expansion during the compression molding. In one embodiment, the compensated marked carrier 108 is made of Alloy 46 with a CTE in a range of 7 to 11 ppm/° C., and preferably a CTE of around 7.8 ppm/° C. In another preferred embodiment, the molding compound has a Coefficient of Thermal Expansion (CTE) close to the compensated marked carrier 108 so that the expansion of the compensated marked carrier 108 would be minimized in relation to the molding layer 240. For example, the molding compound may be G730 with the Coefficient of Thermal Expansion (CTE) of around 7.0 ppm/° C. so that the molding layer 240 would shrink less than 0.06% when it is cooled down from the molding temperature to the room temperature.

FIG. 12A shows a cross-sectional view of the molded panel 242 in which the compensated gap 159 is restored to the original gap 158 due to various influences, such as the thermal-mechanical (TM) effect and the mold compound fluid flow (FF) effect during the compression molding. FIG. 12B shows a top view that the same live die 200 is shifted away from the bonded location 160 (indicated by a dashed rectangle) to a molded location 162 so that the adjacent bonded live dies 200 are spaced apart by the original gap 158 in the molded panel 242 after the compression molding. Optionally, a grinding process may be applied to the molded panel 242 with a grinding wheel 258 to remove a top portion of the molding layer 240 for reducing a thickness of the molded panel 242, for relieving internal stress generated during the compression molding, as well as for making a back side 246 more flat of the molded panel 242 for subsequent processes. The back surface 210 of the live die 200 may be exposed from the back side 246 of the molded panel 242. The molded panel 242 also has a front side 244 which include the active surfaces 208 of the live dies 200 embedded in the molded panel 242.

FIG. 13 illustrates a releasing process of Step S24 of the compensating method S20. The molding panel 242 would be released from the compensated marked carrier 108 since the heat release tape 120 would lose adhesivity under an elevated temperature (such as at around 200° C.). After being released, the front side 244 of the molded panel 242 including the active surfaces 208 of the live dies 200 are exposed from the heat release tape 120 and the compensated marked carrier 108.

Figure 14:
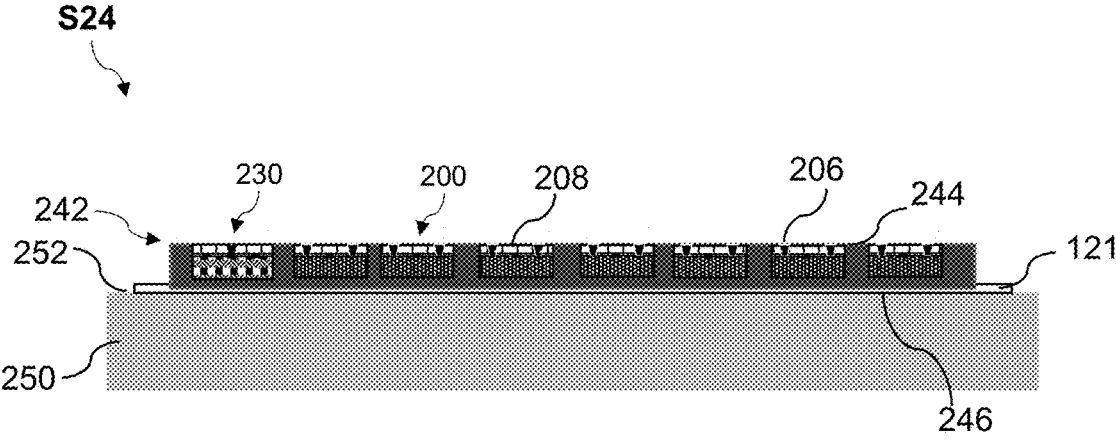
FIG. 14 illustrates a schematic diagram of a transferring process in Step S24 of the compensating method S20.

Then, as shown in FIG. 14, the molded panel 242 is transferred and mounted onto another heat release tape 121 and a carrier plate 250 in a flipped manner, i.e., the back side 246 of the molded panel 242 is in contact with the heat release tape 121 and the carrier plate 250, while the front side 244 of the molded panel 242 faces away from the heat release tape 121 and the carrier plate 250 so that the front side 244 including the active surfaces 208 of the live dies 200 is exposed. Similar to heat release tape 120, heat release tape 121 is adhered to the carrier plate 250 on one side and to the molded panel 242 on the other. Therefore, the heat release tape 121 may have a similar structure with the heat release tape 120; and under an elevated temperature (such as at around 200° C.), the molded panel 242 would be released from the heat release tape 121 and the carrier plate 250. The carrier plate 250 also has a rather flat front surface 252 to be compatible with the back side 246 of the molded panel 242 which is ground to be flat as shown in FIG. 12A. The carrier plate 250 may be made of the same material as the blank carrier 100 (or the compensated marked carrier 108), such as Alloy 42.

Figure 15:
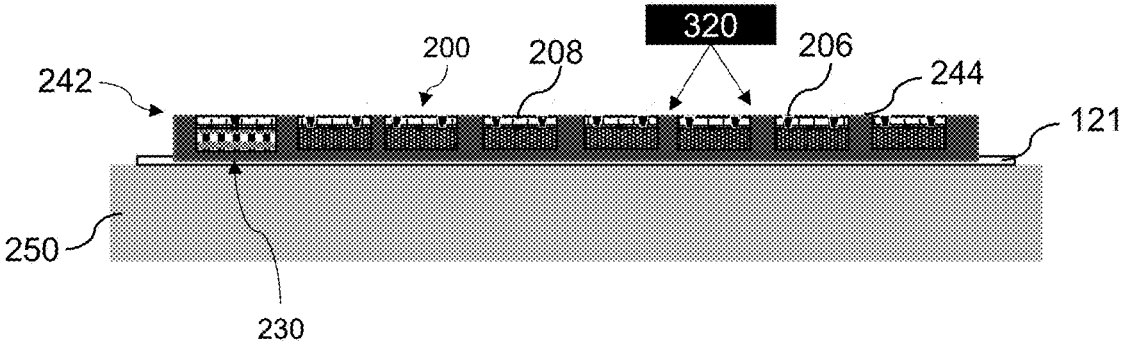
FIG. 15 illustrates a schematic diagram of an optional step of die location check (DLC)

As described above, the original gap 158 is generally restored during the compression molding by applying compensation first. However, minor translational and/or orientational misalignment to the green file may occur during the bonding process and/or compression molding. Therefore, a die location check (DLC) may optionally be conducted on the front side 244 of the molded panel 242 to verify the accurate positions of the live dies 200 and the reference dies 230 in the molded panel 242. FIG. 15 illustrates the DLC process, which detects special features such as the filled-vias 206 or the pre-vias 207 of the live dies 200 and the reference die 230. The DLC process may be conducted by the vision apparatus 300 using the look-down camera assembly 320. Alternatively, the DLC process may be conducted by an independent camera or similar devices suitable for detecting the special features of the live dies 200 and the reference dies 230.

Figure 16A:
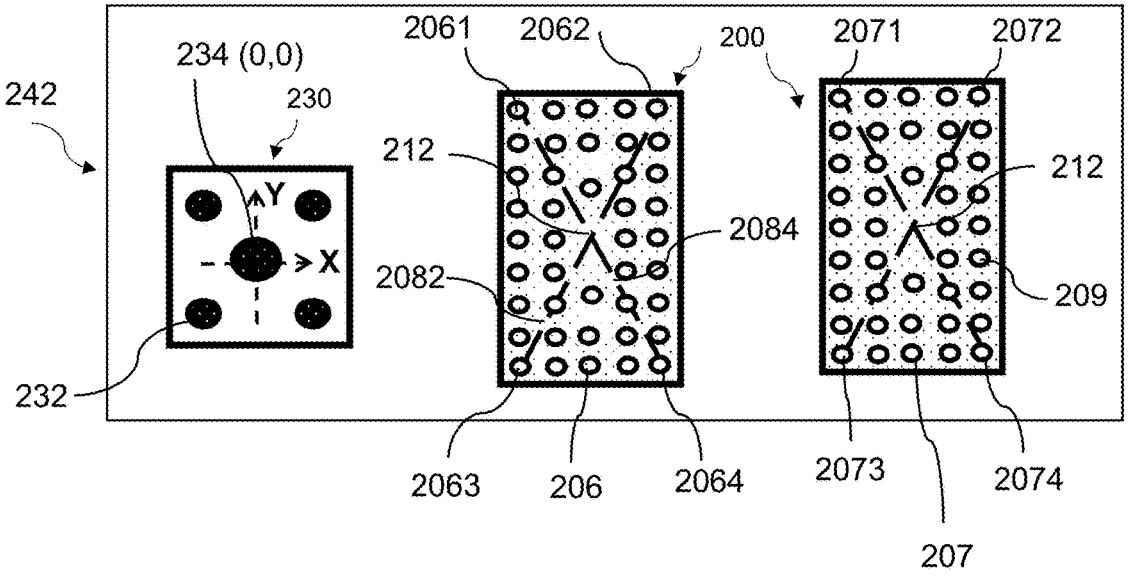
FIGS. 16A and 16B illustrate schematic diagram of DLC results of the live dies and the reference die in a molded panel.

FIG. 16A shows a top view of a DLC result with translational misalignment only (without orientational misalignment) of the live dies 200 and the reference die 230 in the molded panel 242. The reference die 230 has reference features 232 at four corners which would further determine a reference center 234 of the reference die 230. Then, the reference center 234 can be used as an origin (0,0) of a Cartesian coordinate system for the molded panel 242 in order to determine the locations of the live dies 200 in the molded panel 242. Without orientational misalignment, the location of the live dies 200 in the coordinate system can be represented by their respective coordinates (x, y) of the virtual die center 212. As described above, the virtual die center 212 can be determined by firstly identifying the filled-vias 2061-2064 or the die pads 209 exposed from the pre-vias 2071-2074 during the DLC process; then drawing the first and the second diagonal virtual lines 2082, 2084; and finally, determining the intersectional point of the first and the second diagonal virtual lines 2082, 2084 to be the virtual die center 212.

Figure 16B:
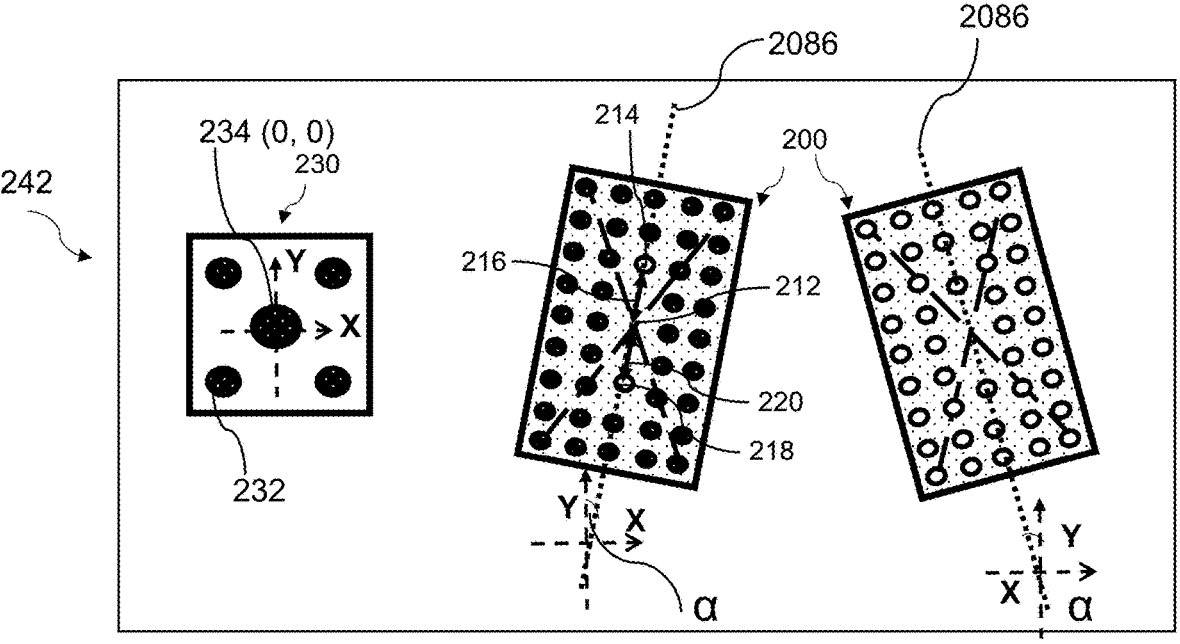

FIG. 16B shows a top view of another DLC result with orientational misalignment of the live dies 200 and the reference die 230 in the molded panel 242. Similarly, the reference center 234 can be used as the origin (0,0) of the Cartesian coordinate system for the molded panel 242 to determining the orientational misalignment. However, in addition to the virtual die center 212, the first and second virtual die reference points 214, 218 are also used to represent the location of the live dies 200 in the Cartesian coordinate system. As described above. the first and second virtual die reference points 214, 218 are determined by shifting the first and second die distances 216, 220 from the virtual die center 212 respectively. A virtual orientational line 2086 (as indicated by a dotted line in FIG. 16B) is drawn by connecting the first and the second virtual die reference point 214, 218; and an angle $\alpha$ is then determined as between the Y-axis of the Cartesian coordinate system and the virtual orientational line 2806. The orientational misalignment of the live dies 200 can be measured by the angle $\alpha$ which would be zero if there is no orientational misalignment. It is understood that an angle $\beta$ between the X-axis of the Cartesian coordinate system and the virtual orientational line 2806 can also represent the orientational misalignment.

The DLC results may be then imported into the computing apparatus 110. Now, the green file stored in the memory device 1102 does not match with the DLC results due to the translational misalignment and/or the orientational misalignment. The computing apparatus 110 has a matching algorithm 1108 for comparing and/or matching the green file to the DLC results so that the positions and orientations of the live dies 200 in the molded panel 242 are updated and then stored in the memory device 1102. Then, the computing apparatus 110 would generate and export a circuit file according to the updated green file for performing Step S25 of the compensating method S20.

Figures 17A, 17B:
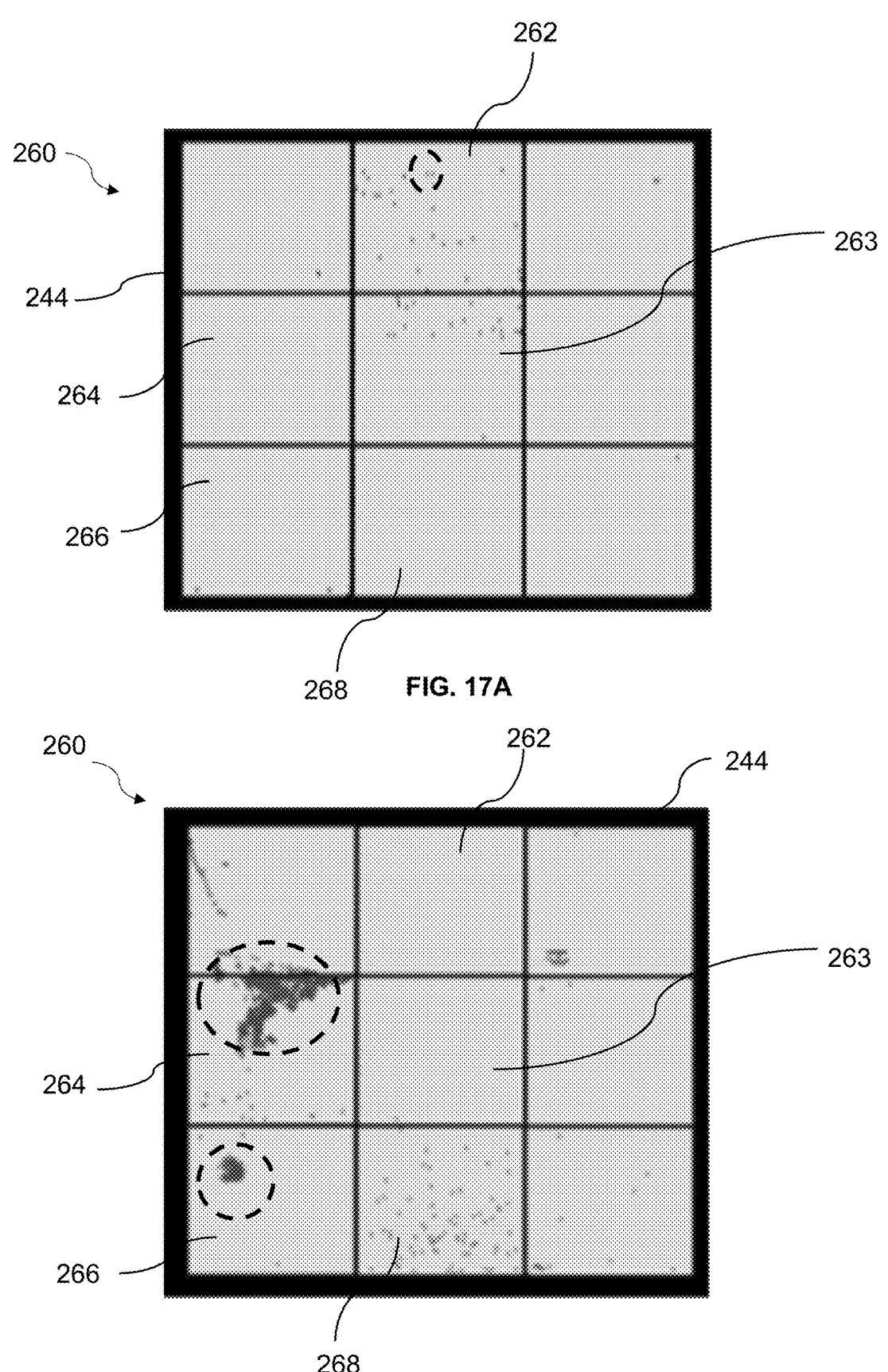
FIGS. 17A and 17B illustrate statistical diagram of misalignment of the live dies before and after the compression molding.

FIGS. 17A and 17B illustrates statistical diagrams 260 of the misalignment of the live dies 200 before (which is caused by the bonding process) and after the compression molding (which is caused by the compression molding) from the front side 244 of the molded panel 242. The DLC process as described above may be conducted over the active surface 208 of the live die 200 to identify the translational and/or orientational misalignment before the compression molding. As shown in FIG. 11A. the look-down camera assembly 320 of the vision apparatus 300 is used for detecting the misalignment.

Black dots as indicated by dashed circles in FIGS. 17A and 17B show that the misalignment of the live dies 200 is more than either a tolerance of the translational misalignment, the orientational misalignment, or both. In FIG. 17A, a small number of the black dots scatter in a first area 262 and a second area 263; and meanwhile the black dots are rarely observed in other areas. In FIG. 17B, a much greater number of black dots are observed. The black dots accumulate in a third area 264, a fourth area 266 and a fifth area 268. However, the black dots are rarely observed in the first area 262 and the second area 263. Therefore, the statistical data before and after the compression molding indicate that the misalignment of live dies 200 generated during the bonding process may be eliminated by the die shift in the compression molding; but the die shift would cause much more live dies 200 to be misaligned in the compression molding in other areas. Therefore, the present disclosure aims to correct the die shift generated during the compression molding as a major cause for translational and/or orientational misalignment for the live dies 200.

Therefore, the green file is updated by first using the matching algorithm 1108 of the computing apparatus 110 to compare the translational and/or orientational misalignment of the semiconductor dies from the DCL process with the tolerance of the misalignment by; then labelling those semiconductor dies of which the translational and/or orientational misalignment is greater than the tolerance in the statistical diagrams 260 such as the black dots; and finally adjusting positions and/or orientations of those labelled semiconductor dies in the green file. Conversely, those semiconductor dies of which the translational and/or orientational misalignment is less than the tolerance are not labelled in the statistical diagrams 260; and the positions and/or orientations of the unlabeled semiconductor dies remain unchanged in the green file.

Figures 18A, 18B, 18C:
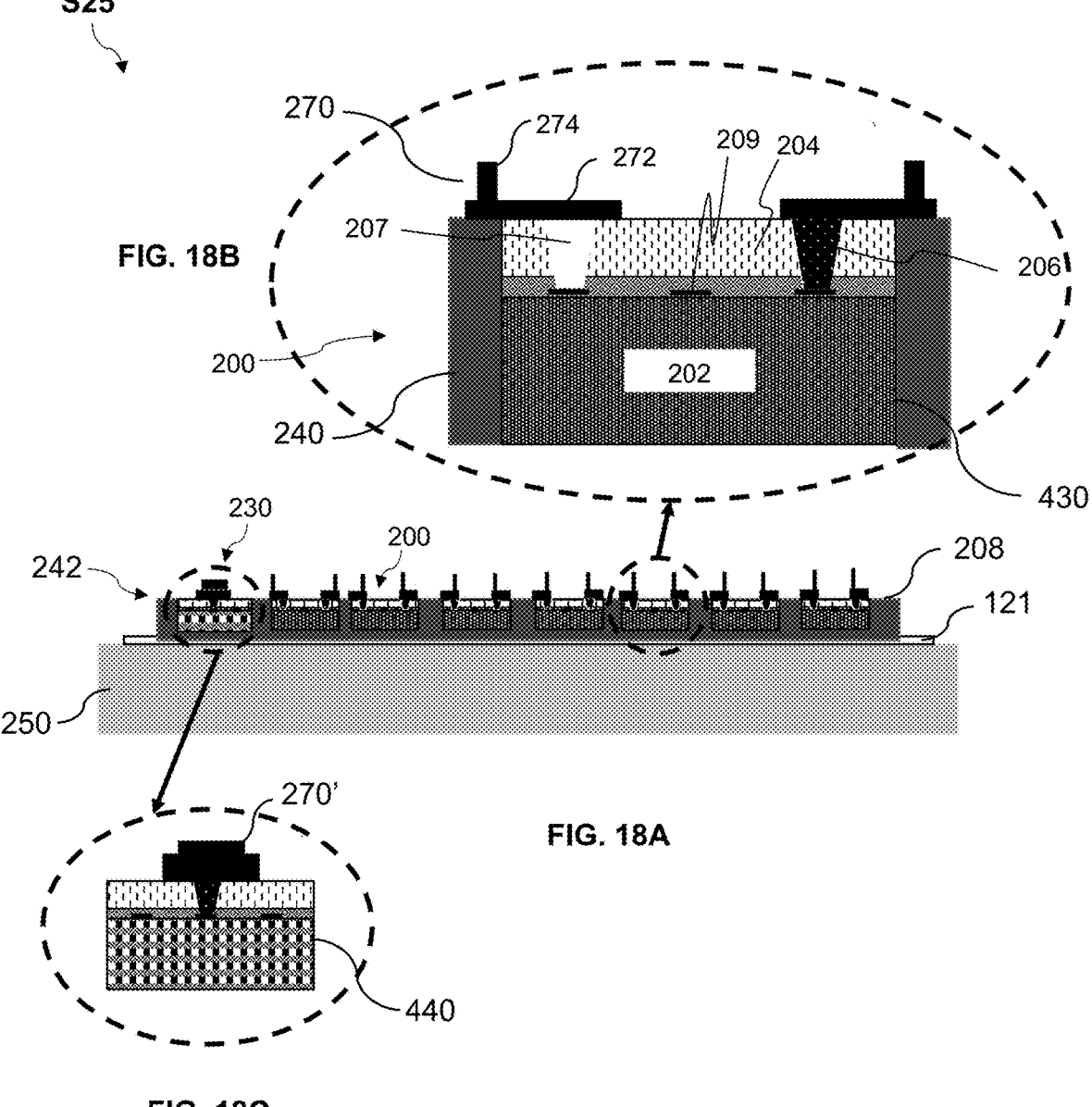
FIGS. 18A to 18C illustrate schematic diagrams of Step S25 of the compensating method S20.

FIGS. 18A to 18C illustrate schematic diagrams of Step S25 of the compensating method S20. FIG. 18A shows a cross-sectional view of the molded panel 242 and the circuit layer 270 formed on the front side 244 of the molded panel 242. FIG. 18B shows an enlarged cross-sectional view of the circuit layer 270 formed on the live die 200. The circuit layer 270 is coupled to the filled-vias 206 in the protective layer 204 for leading out the die pads 209 on the Silicon die 202. FIG. 18C shows an enlarged cross-sectional view of a circuit layer 270' formed on the reference die 230. The circuit layer 270' has a different structure from the circuit layer 270 so that the reference die 230 can be easily differentiated from the live dies 200. The circuit layer 270 of the live die 200 may have a redistribution layer (RDL) 272 coupled to the filled-vias 206 which extends beyond a live die profile 430 of the live die 200 (i.e., a fan-out circuit layer); and multiple studs 274 formed on and coupled to the RDL 272. Accordingly, the circuit file may contain a RDL file for forming the RDL layer 272 coupled to the die pads 209 and a stud file for forming the studs 274. The DLC process may be conducted to update the RDL file in relation to the circuit layer 270, 270'; and to update the stud file in relation to the RDL layer 272. The circuit layer 270' of the reference die 230 may be restricted within a reference die profile 440 (i.e., a fan-in circuit layer). Alternatively, the circuit layer 270' of the reference die 230 can be the same as the circuit layer 270 of the live die 200 if one of the live dies 200 is used as the reference die 230. The circuit layer 270 of the live die 200 and the circuit layer 270' of the reference die 230 are formed by precisely following the circuit file according to the update green file as described above. If the filled-vias 206 are not formed before this step, the pre-vias 207 in the protective layer 204 are filled with conductive materials to form the filled-vias 206 before Step S25.

FIG. 19 illustrates a schematic diagram of Step S26 of the compensating method S20. A dielectric layer 280 is formed with dielectric materials for encapsulating the circuit layers 270, 270' in order to protect the circuit layers 270, 270' from moisture and other environmental hazards. The dielectric layer 280 may be formed by any suitable means, such as film molding by applying a film of a dielectric material onto the circuit layers 270, 270'. Preferably, the dielectric layer 280 is made by compression molding of the same molding compounds as the molding layer 240 so that the molding layer 240 and the dielectric layer 280 could have better compatibility at their interface 282 to make the semiconductor packages more structurally stable.

FIG. 20 illustrates a schematic diagram of Step S27 of the compensating method S20. A portion of the top of the dielectric layer 280 is removed by the grinding wheel 258 to expose the circuit layers 270, 270'. Therefore, the live dies 200 can be electronically connected to external devices via the exposed circuit layers 270, 270'.

FIG. 21A illustrates a schematic diagram of Step S28 of the compensating method S20. An external connection layer 290 is formed on the remaining dielectric layer 280 after the grinding. The external connection layer 290 may include multiple solder balls 292 coupled to the exposed circuit layer 270. The solder balls 292 are made of electrically conducting materials such as Copper (Cu) for leading out the live dies 200 via the circuit layer 270. In accordance with the circuit file, the computing apparatus 110 would first generate and export an external connection file for the external connection layer 290; and then the external connection file exported is communicated to a stencil device for forming the solder balls 292.

Figure 22A:
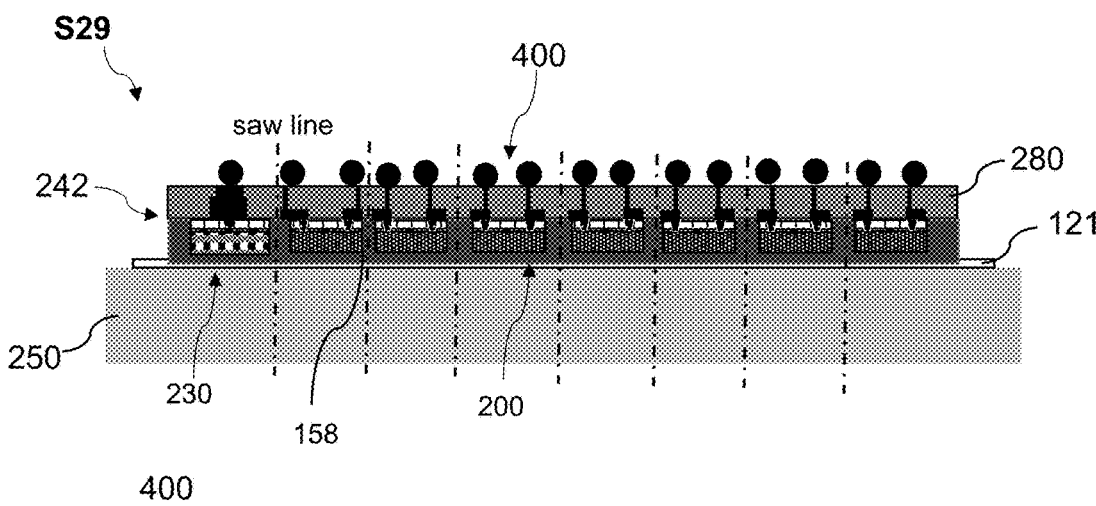
FIGS. 22A and 22B illustrate a schematic diagram of Step S29 of the compensating method S20.

FIG. 22A illustrates a schematic diagram of Step S29 of the compensating method S20. The molded panel 242 with the circuit layer 270 and the solder balls 292 as the external connection layer 290 are singulated into individual semiconductor packages.

Figure 23:
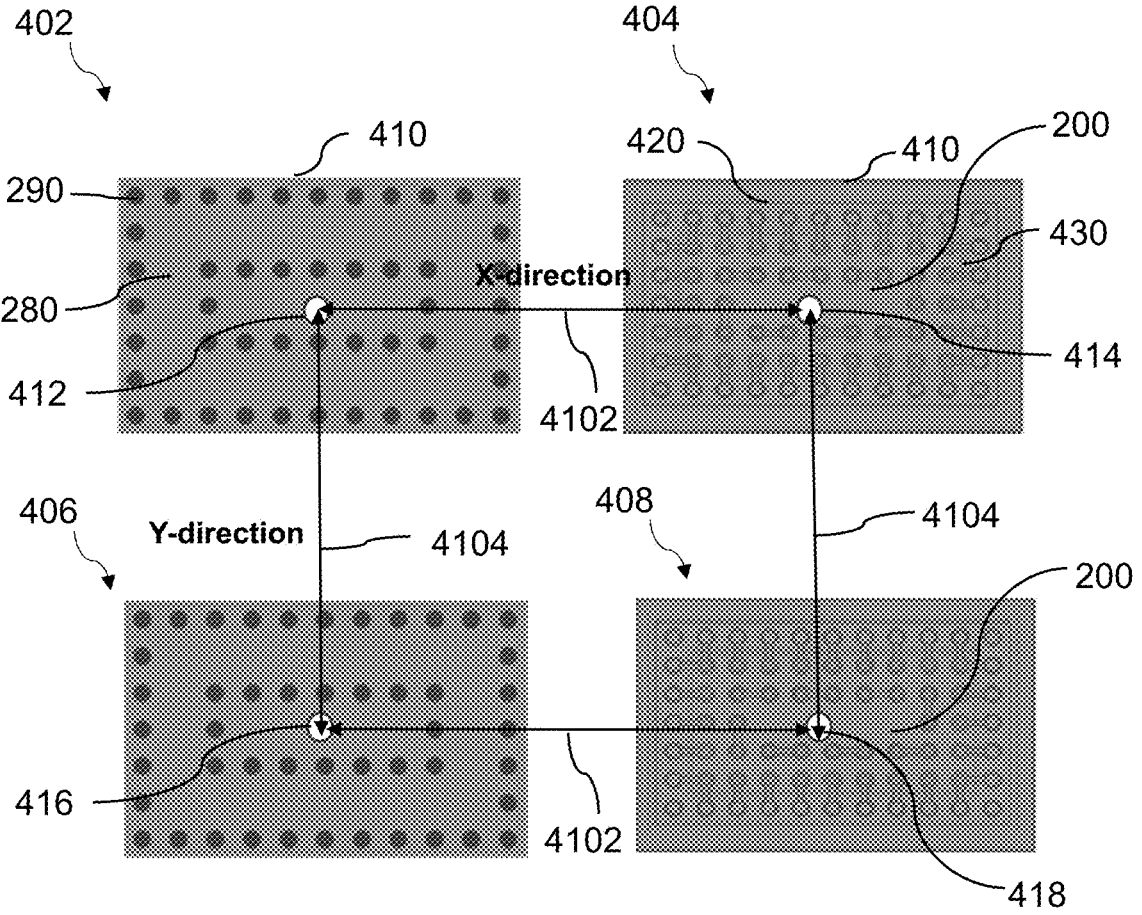
FIG. 23 illustrates a schematic diagram of a single chip module from the compensating method S20.

FIG. 23 shows a top view (the left) and a perspective view (the right) of four adjacent single chip modules (SCM) 400 (i.e., a first SCM 402, a second SCM 404, a third SCM 406 and a fourth SCM 408) of the semiconductor packages where the single chip module 400 includes a single live die 200 in the perspective view. A package profile 410 is shown in FIG. 23 for the single chip module 400 to indicate a size of the semiconductor package. It is shown that that the external connection layer 290 of the single chip module 400 are formed in accordance with the circuit layer 270. It is also shown that the solder balls 292 are formed within a circuit profile 420. FIG. 23 shows a fan-out semiconductor package for the single chip module 400 as the circuit profile 420 extends outside the live die profile 430. It is understood that a fan-in semiconductor package can also be made for the single chip module 400 where the circuit profile 420 is within the live die profile 430.

FIG. 23 also shows a first package gap 4102 in an X-direction measured between a first package center 412 of the first SCM 402 and a second package center 414 of the second SCM 404, or between a third package center 416 of the third SCM 406 and a fourth package center 418 of the fourth SCM 408. Similarly, a second package gap 4104 in a Y-direction is measured between the first package center 412 and the third package center 416, or between the second package center 414 and the fourth package center 418. In one embodiment, the first package gap 4102 and the second package gap 4104 are specified to be 1.835 and 3.035 millimeters (mm) in the X-direction and Y-direction respectively in the green file. The simulation plot 124 shows that the first and the second package gaps 4102, 4104 would increase by 0.060% and 0.056% to 1.8361 and 3.0367 millimeters (mm) respectively due to the expansion during the compression molding. In order to keep with what are specified for the first and the second package gaps 4102, 4104 in the green file, the first and the second package gap 4102, 4104 should be reduced by 0.060% and 0.056% in the X-direction and the Y-direction, respectively before performing the compression molding. The reduction of the first and the second package gaps 4102, 4104 are conducted by the compensating method S20 as described above, i.e., by compensating the original gap 158 to the compensated gap 159 before the compression molding between semiconductor dies. Then, along with the expansion of the compensated gap 159 back to the original gap 158 during the compression molding, the first and the second package gaps 4102, 4104 are also restored as what they are specified in the green file. In particular, the simulation plot 124 would calculate predictively the compensation factor 115 to transform the original 158 gap to the compensated gap 159 in order to reduce the first and the second package gaps 4102, 4104 between the SCM of semiconductor packages by 0.060% and 0.056% in the X-direction and the Y-direction, respectively. Alternatively, the simulation algorithm 1106 of the computing apparatus 110 may generate a simulation plot (not shown) similar to the simulation plot 124. Instead of displacing the semiconductor dies (including the live dies 200) in simulation plot 124 as shown in FIG. 4B, this simulation plot herein is conducted to calculate displacement of the SCM 400 of the semiconductor packages. Since the virtual die center 212 is usually defined as the package centers 412-418 for the SCM 402-408 of the semiconductor packages, the compensated gap 159 between the live dies 200 can also be calculated from the expansion or the contraction of the first and the second package gaps 4102, 4104 of the SCM 402-408. Therefore, the first and the second package gaps 4102, 4104 is restored to what they are specified in the green file when the compensated gap 159 is restored to the original gap 158 of the green file through the expansion or the contraction during the compression molding.

Figure 21B:
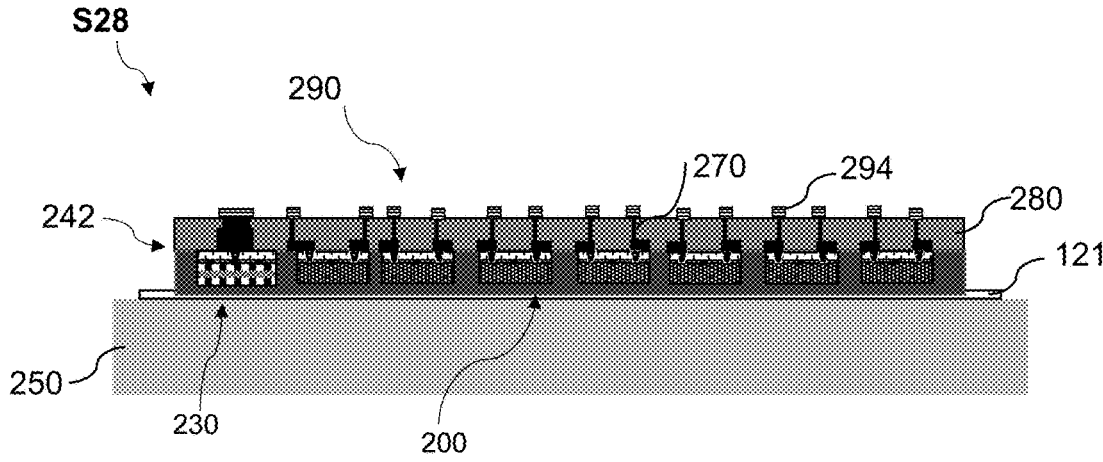

Instead of solder balls 292, FIG. 21B illustrates that the external connection layer 290 may include a surface finish layer 294 formed onto the exposed circuit layer 270 for providing a very flat surface for Input/Output (I/O), facilitating connections to external components such as PCB. The surface finish layer 294 may be made of a single layer of metals such as Tin or a single layer of metal composites such as Nickel/Gold. Alternatively, the surface finish layer 294 may be made of multiple layers. In some embodiments, the surface finish layer 294 is made of Electroless Nickel Immersion Gold (ENIG) which has a two-layer metallic surface finish with a first layer of Nickel plated on the exposed circuit layer 270 using an electroless chemical reaction; and then a very thin layer of Gold plated onto the layer of Nickel. In other embodiments, the surface finish layer 294 is made of Electroless Nickel Electroless Palladium Immersion Gold (ENEPIG) which is formed by deposition of electroless Nickel onto the exposed circuit layer 270, followed by electroless palladium, and finally an immersion gold flash. The surface finish layer 294 is chemically compatible with the I/O for improving stability of connection to the external components such as PCB. The surface finish layer 294 may have a thickness in a range of 1 to 10 μm, preferably 1 to 5 μm, or more preferably 1 to 3 μm.

Figure 22B:
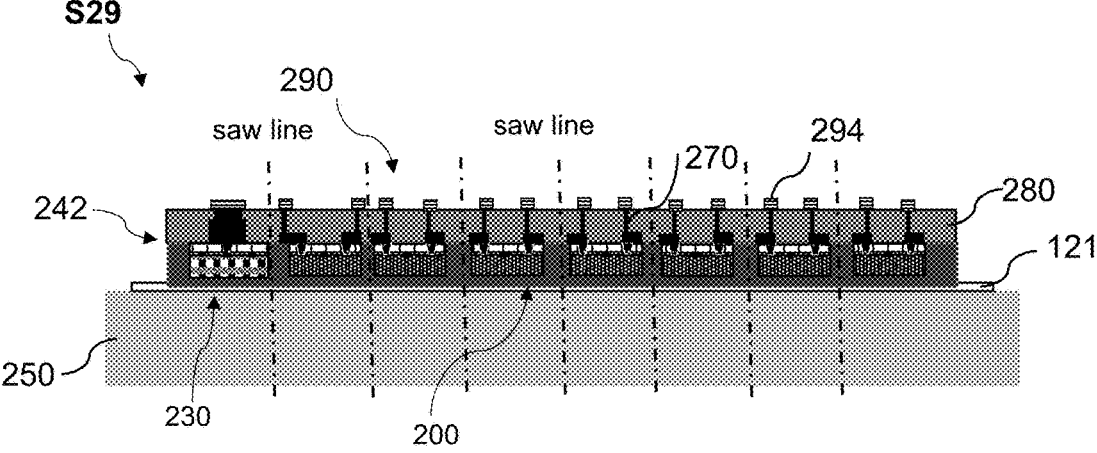

Following FIG. 21B, the singulation process as described in FIG. 22A is shown in FIG. 22B. Therefore, a single chip module of the semiconductor packages would be produced, similar to the single chip module 400. Instead of the solder balls 292, the similar single chip module 400 has the surface finish layer 294 for electronical connection to external components such as PCB.

Figure 24:
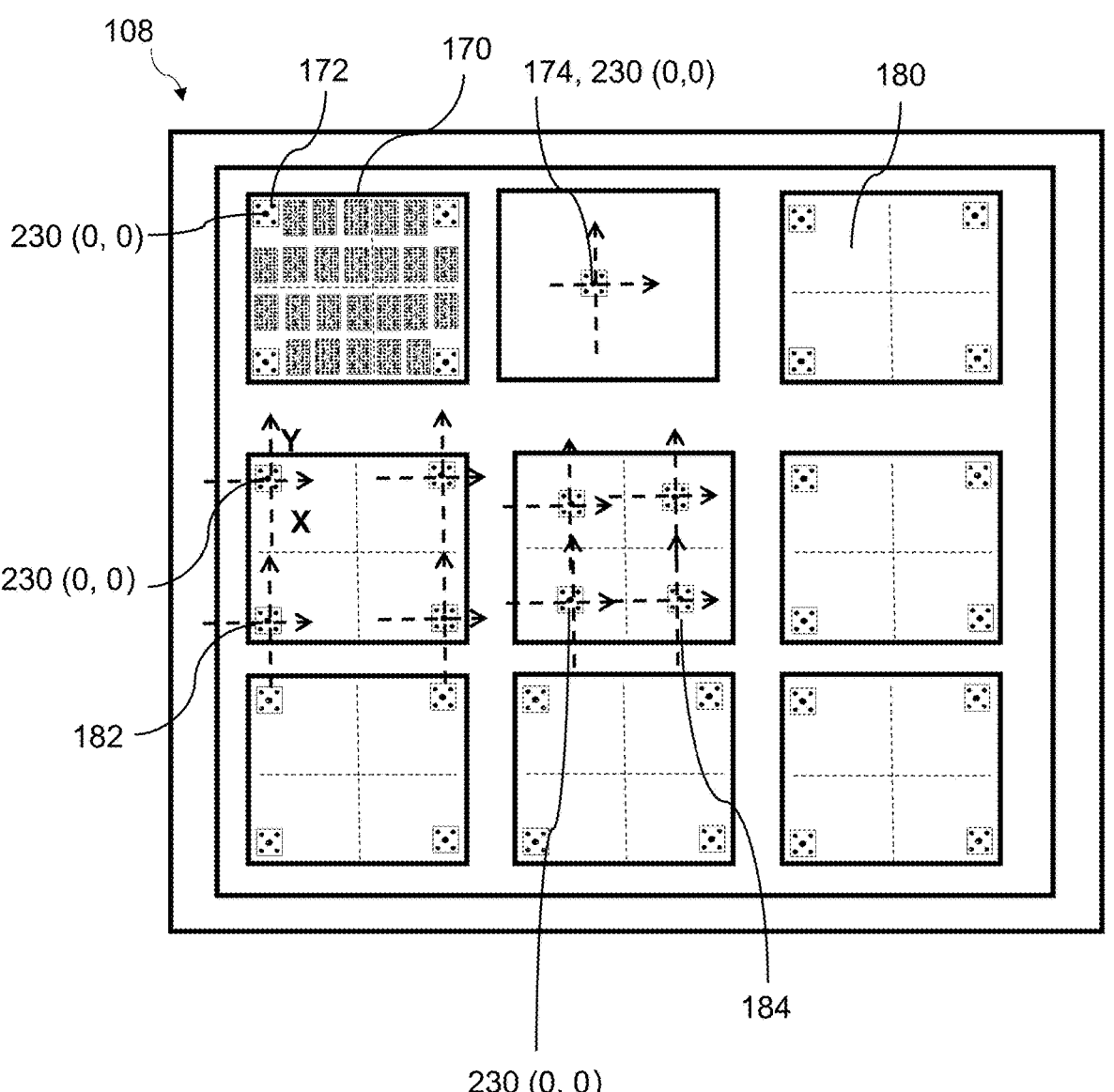
FIG. 24 illustrates a schematic diagram of the compensated marked carrier divided into multiple blocks and sub-blocks.

Compared with the semiconductor dies (such as the live dies 200 and the reference dies 230), the compensated marked carrier 108 usually has a much larger size so that several hundreds or even thousands semiconductor dies could be accommodated on the single compensated marked carrier 108 for enhancing production efficiency. However, the larger the compensated marked carrier 108 is, the more possible the semiconductor dies accommodated thereon may be misaligned during the bonding process. Therefore, the compensated marked carrier 108 may be divided into multiple blocks 170 with their respective reference dies 230; and then the live dies 200 are bonded into the multiple blocks 170. FIG. 24 illustrates a schematic diagram of the compensated marked carrier 108 divided into 9 blocks 170 which may have a same size or different sizes. Each block 170 has its own reference die 230 as an origin (0,0) for determining the locations of the live dies 200 accommodated in this specific block 170 more precisely. The reference die 230 may be at a block corner 172 of the block 170. Alternatively, the reference die 230 may be at a block center 174 of the block 170. Similarly, the block 170 may be further divided into multiple sub-blocks 180 (such as 4 sub-blocks 180 in FIG. 24); and each sub-block 180 may have its own reference die 230 as an origin (0,0) for determining the locations of the live dies 200 accommodated in this specific sub-block 180 more precisely. The reference die 230 may be at a sub-block corner 182 of the sub-block 180. Alternatively, the reference die 230 may be at a sub-block center 184 of the sub-block 180. The sub-blocks 180 may have a same size or different sizes within its block 170. Similarly, the sub-blocks 180 may be further divided into multiple smaller units each of which has its reference dies 230 as an origin (0,0) for this specific smaller unit. However, the more reference dies 230 placed onto the compensated marked carrier 108, the less live dies 200 can be accommodated thereon; and the lower the production efficiency would be for the compression molding and subsequent processes.

FIGS. 25A and 25B illustrate photographs of a multiple chips module (MCM) 500 which includes two or more live dies 200 in a single semiconductor package. FIG. 25A shows a top view of the compensated bonding unit 130 with four physical carrier markings 106 at four corners on the compensated marked carrier 108. The compensated bonding unit 130 have three compensated sub-bonding units 510, 520, 530 for accommodating three live dies 514, 524, 534 respectively. It is understood that the compensated bonding unit 130 may also have any number of the compensated sub-bonding units (2, 4 or more compensated sub-bonding units other than the 3 compensated sub-bonding units 510, 520, 530), in accordance to the number of live dies 200 that would be accommodated into the compensated bonding unit 130 for making the MCM 500. Each compensated sub-bonding units 510, 520, 530 also have its own sub-physical carrier markings 512, 522, 532 for determining locations within the compensated sub-bonding units 510, 520, 530 when bonding the live dies 514, 524, 534 within the compensated bonding unit 130 on the compensated marked carrier 108. FIG. 25B shows a top view that the live dies 514, 524, 534 are bonded onto the compensated marked carrier 108. It is shown that the live dies 514, 524, 534 cover their respective sub-physical carrier markings 512, 522, 532. However, it is understood that the sub-physical carrier markings 512, 522, 532 may be exposed from the live dies 514, 524, 534.

After being bonded in the compensated bonding unit 130 as shown in FIG. 25B, the live dies 514, 524, 534 on the compensated marked carrier 108 would to go through the compression molding and the subsequent processes as described above. During the DLC process, one of the live dies 514, 524, 534 (such as a first live die 514) may be used as an origin (0,0) of a coordinate system for the MCM 500. For example, a first die center 5142 of the first live die 514 may be used as the origin (0,0) of the coordinate system. Then, relative locations of the other live dies (such as a second live die 524 and a third live die 534) within the MCM 500 can be determined in relation to the origin (0.0) of the coordinate system. The origin (0,0) is arbitrarily determined and may be at any locations within the MCM 500, such as a second die center 5144 of the second live die 524, a third die center 5146 of the third live die 534, or a module center 5148 of the MCM 500 not within any of the live dies 514, 524, 534. The DLC result can be more accurately measured by employing the coordinate system within the MCM 500, in addition to the coordinate system with the origin (0,0) at the reference die 230 for the blocks 170 or sub-blocks 180 as described above in FIG. 24. After singulation, individual MCM 500 is produced as shown in FIG. 26. The live dies 514, 524, 534 may have different electronic functions; and also communicate internally for fulfilling an electronic function of the MCM 500 as a whole. For example, the live die 514 may be responsible for storing information, the live die 524 may function to process the information, and the live die 534 may first receive the information from external electronic devices and then send out the processed information to the external electronic devices.

In the application, unless specified otherwise, the terms "comprising", "comprise", and grammatical variants thereof, intended to represent "open" or "inclusive" language such that they include recited elements but also permit inclusion of additional, non-explicitly recited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. The description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

It will be apparent that various other modifications and adaptations of the application will be apparent to the person skilled in the art after reading the foregoing disclosure without departing from the spirit and scope of the application and it is intended that all such modifications and adaptations come within the scope of the appended claims.

What is claimed is:

1. A method of compensating a die shift of semiconductor dies in compression molding, comprising:

providing a compensated marked carrier with a plurality of physical carrier markings, wherein the plurality of physical carrier markings is made according to compensated projected markings transformed from original projected markings by a compensation factor in a computing apparatus, and the original projected markings are generated by original virtual carrier markings through projection, the original virtual carrier markings are derived from an original green file;

bonding the semiconductor dies onto the compensated marked carrier according to the plurality of physical carrier markings; and performing the compression molding to form a molding layer for encapsulating the semiconductor dies into a molded panel, wherein the original projected markings and the compensated projected markings determine an original gap and a compensated gap respectively between two adjacent semiconductor dies, and wherein the die shift caused by the compression molding is compensated by changing the original gap to the compensated gap when bonding the semiconductor dies onto the compensated marked carrier.

2. The method of claim 1, further comprising:

applying a heat release tape onto a front surface of the compensated marked carrier before bonding the plurality of semiconductor dies onto the front surface, wherein the heat release tape is transparent or semitransparent for detecting the plurality of physical carrier markings covered by the heat release tape.

3. The method of claim 1, further comprising:

aligning the semiconductor dies to respective compensated bonding units divided on the compensated marked carrier before bonding the semiconductor dies, wherein the compensated bonding units are determined by the physical carrier markings.

4. The method of claim 3, wherein aligning the semiconductor dies comprises:

determining a first virtual die reference point and a second virtual die reference point on an active surface of one of the semiconductor dies;

determining a first virtual carrier reference point and a second virtual carrier reference point on the compensated marked carrier from the physical carrier markings of the compensated bonding units; and matching the first virtual die reference point and the second virtual die reference point to the first virtual carrier reference point and the second virtual carrier reference point, respectively.

5. The method of claim 3, wherein the first virtual carrier reference point and the second virtual carrier reference point are determined by calculating a virtual carrier center from four adjacent physical carrier markings; and shifting a first carrier distance and a second carrier distance from the virtual carrier center to determine the first virtual carrier reference point and the second virtual carrier reference point respectively.

6. The method of claim 3, wherein the first virtual die reference point and the second virtual die reference point are determined by determining a virtual die center from predetermined features of the semiconductor dies; and shifting a first die distance and a second die distance from the virtual die center to determine the first virtual die reference point and the second virtual die reference point respectively.

7. The method of claim 3, wherein aligning the semiconductor dies is performed by a vision apparatus of a vertical co-axis configuration in which an alignment light is configured to be emitted from a single light source and then divided into a look-up beam and a look-down beam into a look-up camera assembly and a look-down camera assembly respectively.

8. The method of claim 3, wherein aligning the semiconductor dies is performed by a vision apparatus of a side-by-side configuration in which a first alignment light is configured to be emitted from a first light source and then reflected upwardly into a look-up camera assembly, and a second alignment light is configured to be emitted from a second light source and then reflected downwardly into a look-down camera assembly.

9. The method of claim 1, further comprising:

performing a die location check (DLC) process to detect misalignment of the semiconductor dies in the molded panel for updating the original green file.

10. The method of claim 1, further comprising:

separating the compensated marked carrier into a plurality of blocks, wherein each block has at least one reference die as an origin of a coordination system for the block for determining locations of semiconductor dies within the block more precisely.

11. A method of fabricating a compensated marked carrier for compensating a die shift of semiconductor dies in compression molding, comprising:

providing a blank carrier;

transforming original virtual carrier markings to compensated virtual carrier markings by applying a compensation factor in a computing apparatus;

projecting the compensated virtual carrier markings onto the blank carrier for indicating locations of compensated projected markings on the blank carrier; and making physical carrier markings at the locations of the compensated projected markings on the blank carrier for forming the compensated marked carrier.

12. The method of claim 11, further comprising:

calculating the compensation factor from a simulation plot by a simulation algorithm using the computing apparatus.

13. The method of claim 11, further comprising:

dividing the compensated marked carrier into a plurality of compensated bonding units by the compensated projected markings, wherein each compensated bonding unit is configured to accommodate at least one of the semiconductor dies.

14. The method of claim 11, wherein projecting the compensated virtual carrier markings onto the blank carrier comprises:

generating a virtual fiducial in the computing apparatus; and overlapping the virtual fiducial to a carrier fiducial of the blank carrier.

15. The method of claim 11, wherein the making physical carrier markings comprises:

forming grooves on a front surface of the compensated marked carrier at the locations of compensated projected markings, wherein the grooves are either cylindrical grooves or truncated grooves.

16. A panel-level semiconductor process to make semiconductor packages, comprising:

compensating a die shift of semiconductor dies due to compression molding using a compensated marked carrier with a plurality of physical carrier markings, wherein the physical carrier markings are made according to compensated projected markings, wherein the compensated projected markings are calculated in a computing apparatus using original projected markings and a compensation factor, the original projected markings are generated by original virtual carrier markings through projection, the original virtual carrier markings are derived from an original green file;

performing the compression molding to form a molding layer for encapsulating the semiconductor dies into a molded panel;

releasing the molding panel from the compensated marked carrier and then transferring the molded panel onto a carrier plate;

forming a circuit layer on a front side of the molded panel;

forming a dielectric layer onto the circuit layer for encapsulating the circuit layer;

removing a top portion of the dielectric layer to expose the circuit layer;

forming an external connection layer coupled to the exposed circuit layer; and separating the molded panel, the circuit layer, the dielectric layer and the external connection layer into individual semiconductor packages;

wherein the original projected markings and the compensated projected markings determine an original gap and a compensated gap respectively between two adjacent semiconductor dies, and wherein the die shift caused by the compression molding is compensated by changing the original gap to the compensated gap when bonding the semiconductor dies onto the compensated marked carrier.

17. The method of claim 16, further comprising:

performing a die location check (DLC) process to detect misalignment of the semiconductor dies in the molded panel;

updating the original green file in the computing apparatus into an updated green file, according to the misalignment; and generating a circuit file according to the updated green file in the computing apparatus, wherein the circuit layer is formed according to the circuit file.

18. The method of claim 17, wherein updating the original green file comprises:

comparing the misalignment of the semiconductor dies from the DLC process with a tolerance of the misalignment by a matching algorithm of the computing apparatus;

labelling the semiconductor dies of which the misalignment is greater than the tolerance in a statistical diagram; and adjusting positions and/or orientations of the labelled semiconductor dies in the original green file.

19. The method of claim 16, wherein the compensated projected markings are transformed from original projected markings by transforming the original virtual carrier markings to compensated virtual carrier markings in the computing apparatus by the compensation factor; and imaginarily forming the compensated projected markings from the compensated virtual carrier markings through projection, wherein the original gap is transformed to the compensated gap along with the transformation of the original projected markings to the compensated projected markings.

20. The method of claim 16, further comprising:

dividing the compensated marked carrier into a plurality of compensated bonding units by the compensated projected markings;

dividing at least one of the compensated bonding units into a plurality of sub-bonding units by sub-physical carrier markings within the compensated bonding unit; and bonding the semiconductor dies into the plurality of sub-bonding units respectively for forming Multi-Chip Modules (MCMs).

* * * * *